United States Patent
Yoon et al.

(10) Patent No.: US 9,910,607 B2
(45) Date of Patent: Mar. 6, 2018

(54) METHOD OF MANAGING A MEMORY, AND A MEMORY SYSTEM

(71) Applicants: Sangyong Yoon, Seoul (KR); Jinman Han, Seongnam-si (KR)

(72) Inventors: Sangyong Yoon, Seoul (KR); Jinman Han, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 855 days.

(21) Appl. No.: 14/332,892

(22) Filed: Jul. 16, 2014

(65) Prior Publication Data

US 2015/0178000 A1   Jun. 25, 2015

(30) Foreign Application Priority Data

Dec. 23, 2013 (KR) .......................... 10-2013-0161732

(51) Int. Cl.
| | | |
|---|---|---|
| G11C 16/06 | (2006.01) | |
| G06F 3/06 | (2006.01) | |
| G11C 16/04 | (2006.01) | |
| G11C 29/02 | (2006.01) | |

(52) U.S. Cl.
CPC .......... G06F 3/0619 (2013.01); G06F 3/0647 (2013.01); G06F 3/0679 (2013.01); G11C 16/0483 (2013.01); G11C 29/024 (2013.01)

(58) Field of Classification Search
CPC . G06F 3/0647; G06F 3/0619; G11C 16/0413; G11C 29/024; G11C 3/0619; G11C 3/0679

USPC ...................................................... 365/185.09
See application file for complete search history.

(56) References Cited

U.S. PATENT DOCUMENTS

| | | | |
|---|---|---|---|
| 5,434,814 A * | 7/1995 | Cho .................... | G11C 29/822 365/104 |
| 6,567,305 B2 | 5/2003 | Nakamura | |
| 6,740,940 B2 * | 5/2004 | Kim ..................... | H01L 23/564 257/341 |
| 7,177,192 B2 | 2/2007 | Yoon et al. | |
| 7,251,756 B2 * | 7/2007 | Anand ................. | G11C 17/165 714/710 |
| 7,379,330 B2 * | 5/2008 | Conley ............... | G11C 16/0483 365/185.09 |
| 7,791,947 B2 | 9/2010 | VanBuskirk et al. | |
| 8,427,872 B2 * | 4/2013 | Kim ..................... | G11C 29/846 365/185.09 |
| 8,498,153 B2 * | 7/2013 | Seong ................. | G11C 11/5628 365/185.03 |
| 8,711,625 B2 * | 4/2014 | Li ........................ | G11C 29/808 365/185.09 |
| 8,958,247 B2 * | 2/2015 | Asaoka ................ | G11C 16/06 365/185.17 |

(Continued)

FOREIGN PATENT DOCUMENTS

| | | |
|---|---|---|
| JP | 2011065744 A | 3/2011 |
| KR | 20100106767 A | 10/2010 |

*Primary Examiner* — Viet Q Nguyen
(74) *Attorney, Agent, or Firm* — Harness, Dickey & Pierce, P.L.C.

(57) ABSTRACT

In one embodiment, the method includes determining whether a selection transistor of a currently programmed memory string in the memory has deteriorated, and copying data in the currently programmed memory string to a different memory string of the memory if the determining determines the selection transistor has deteriorated.

20 Claims, 19 Drawing Sheets

(56) References Cited

U.S. PATENT DOCUMENTS

| | | | |
|---|---|---|---|
| 9,299,438 B2* | 3/2016 | Hara | G11C 16/0408 |
| 9,318,212 B2* | 4/2016 | Tokiwa | G11C 16/32 |
| 9,348,694 B1* | 5/2016 | Nassie | G06F 11/1068 |
| 9,529,663 B1* | 12/2016 | Srinivasan | G06F 11/0793 |
| 9,530,514 B1* | 12/2016 | Sabde | G11C 29/04 |
| 9,576,666 B2* | 2/2017 | Shim | G11C 16/0483 |
| 2001/0050862 A1 | 12/2001 | Nakamura | |
| 2005/0057968 A1* | 3/2005 | Lutze | G11C 16/349 |
| | | | 365/185.18 |
| 2006/0104116 A1 | 5/2006 | Yoon et al. | |
| 2008/1030727 | 12/2008 | Li | |
| 2009/0027967 A1* | 1/2009 | Lee | G11C 16/0483 |
| | | | 365/185.15 |
| 2009/0180330 A1 | 7/2009 | VanBuskirk et al. | |
| 2011/0216600 A1 | 9/2011 | Goda et al. | |
| 2012/0051143 A1 | 3/2012 | Yoon et al. | |
| 2012/0113734 A1* | 5/2012 | Yamada | G11C 29/025 |
| | | | 365/201 |
| 2012/0212475 A1* | 8/2012 | Tajika | G09G 3/3283 |
| | | | 345/212 |
| 2012/0327713 A1 | 12/2012 | Parat et al. | |
| 2013/0088921 A1 | 4/2013 | Nam et al. | |
| 2015/0228337 A1* | 8/2015 | Okawa | H01L 27/101 |
| | | | 365/51 |
| 2016/0012916 A1* | 1/2016 | Hara | G11C 29/06 |
| | | | 714/718 |
| 2016/0372199 A1* | 12/2016 | Shim | G11C 16/0483 |
| 2017/0025184 A1* | 1/2017 | Park | G11C 16/3459 |

* cited by examiner

METHOD OF MANAGING A MEMORY, AND A MEMORY SYSTEM

CROSS-REFERENCE TO RELATED APPLICATIONS

This U.S. non-provisional patent application claims priority under 35 U.S.C. § 119 of Korean Patent Application No. 10-2013-0161732, filed on Dec. 23, 2013, the entire contents of which are hereby incorporated by reference.

BACKGROUND OF THE INVENTION

The present inventive concepts herein relates to nonvolatile memory devices and/or driving method thereof.

A semiconductor memory device is a memory device which is embodied using semiconductor such as silicon Si, germanium Ge, gallium arsenide GaAs, indium phospide InP, etc. A semiconductor memory device is classified into a volatile memory device and a nonvolatile memory device.

A volatile memory device loses its stored data when its power supply is interrupted. Examples of the volatile memory device include a static RAM (SRAM), a dynamic RAM (DRAM), a synchronous DRAM (SDRAM), etc. A nonvolatile memory device retains its stored data even when its power supply is interrupted. Examples of the nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc. A flash memory is classified into a NOR type flash memory and a NAND type flash memory.

SUMMARY

At least one embodiment relates to a method of managing a memory.

In one embodiment, the method includes determining whether a selection transistor of a currently programmed memory string in the memory has deteriorated, and copying data in the currently programmed memory string to a different memory string of the memory if the determining determines the selection transistor has deteriorated.

In one embodiment, the determining includes performing a verification operation on the selection transistor of the currently programmed memory string, and determining the selection transistor has deteriorated if the verification operation fails.

In one embodiment, the verification operation includes applying a gate voltage to a gate of the selection transistor, determining whether the selection transistor turns on based on output from the currently programmed memory string, and determining that the verification operation has failed based on whether the selection transistor was determined to turn on.

In one embodiment, the performing applies a first gate voltage to the selection transistor, the copying applies a second gate voltage to the selection transistor, and the first gate voltage is less than the second gate voltage. For example, the performing applies a gate voltage to the selection transistor, and the gate voltage is less than applied during a read operation.

In one embodiment, the currently programmed memory string includes a plurality of memory cell transistors connected in series between a string selection transistor and a ground selection transistor, and the determining determines whether the string selection transistor has deteriorated.

In one embodiment, the currently programmed memory string includes a plurality of memory cell transistors connected in series between a string selection transistor and a ground selection transistor, and the determining determines whether the ground selection transistor has deteriorated.

In one embodiment, the currently programmed memory string includes a plurality of memory cell transistors connected in series between a string selection transistor and a ground selection transistor, and the determining determines whether either one of the ground selection transistor and the string selection transistor has deteriorated.

In one embodiment, the currently programmed memory string includes a string selection transistor, at least a first dummy memory cell transistor, a plurality of memory cell transistors, at least a second dummy memory cell transistor, and a ground selection transistor connected in series, and the determining determines whether either one of the ground selection transistor and the string selection transistor has deteriorated.

In one embodiment, the method further includes performing the determining in response to a command. The command may be a program command, a read command, or a verification command, which indicates to perform the determining.

In one embodiment, the method includes receiving the command from a host.

In one embodiment, the method includes receiving the command from a memory controller associated with the memory.

In one embodiment, the performing performs the determining before an operation associated with the command.

In one embodiment, the performing performs the determining after an operation associated with the command.

In one embodiment, the performing includes generating a count value indicating a number of times the command is received, and triggering performance of the determining if the count value exceeds a reference value.

In one embodiment, reference value is randomly generated.

In one embodiment, the triggering triggers performance of the determining for at least one currently programmed memory string in a memory cluster which was most recently accessed based on the command.

In one embodiment, the performing includes generating a count value indicating a number of times the command is received for a memory cluster including the currently programmed memory string, and triggering performance of the determining if the count value exceeds a reference value.

In one embodiment, the memory cluster is one of a memory string, a block including at least one memory string, and a chip.

In one embodiment, the method further includes performing the determining based on a wear level of a memory cluster including the currently programmed memory string.

In one embodiment, the method further includes storing a result of the determining.

In one embodiment, the method further includes determining whether a memory cluster is bad based on a number of memory strings in the memory cluster determined to be deteriorated, and prohibiting access to the memory cluster if the memory cluster is determined to be bad.

In one embodiment, the memory is a vertical NAND.

At least one embodiment relates to a memory system.

In one embodiment, the memory system includes a memory array including a plurality of memory strings. Each of the plurality of memory strings includes a plurality of memory transistors and at least one selection transistor. The memory system also includes control logic configured to perform a verification operation on a selection transistor of a currently programmed memory string in the memory array. The verification operation indicates whether the selection transistor turns on in response to a first gate voltage. The control logic is configured to perform a copy operation to copy data in the currently programmed memory string to a different memory string of the memory array if the verification operation fails.

In one embodiment, the control logic is configured to perform the verification operation by, applying the first gate voltage to a gate of the selection transistor, and determining whether the selection transistor turns on based on output from the currently programmed memory string.

In one embodiment, the control logic is configured to perform the verification operation by determining that the verification operation fails if the selection transistor turns on.

In one embodiment, a second gate voltage is applied to the selection transistor to read the data from the currently programmed memory string during the copy operation, and the second gate voltage is higher than the first gate voltage.

In one embodiment, each of the plurality of memory strings includes a plurality of memory cell transistors connected in series between a string selection transistor and a ground selection transistor, and the control logic is configured to perform the verification operation on the string selection transistor.

In one embodiment, each of the plurality of memory strings includes a plurality of memory cell transistors connected in series between a string selection transistor and a ground selection transistor, and the control logic is configured to perform the verification operation on the ground selection transistor.

In one embodiment, each of the plurality of memory strings includes a plurality of memory cell transistors connected in series between a string selection transistor and a ground selection transistor, and the control logic is configured to perform the verification operation on either one of the string selection transistor and the ground selection transistor.

In one embodiment, each of the plurality of memory strings includes a string selection transistor, at least a first dummy memory cell transistor, a plurality of memory cell transistors, at least a second dummy memory cell transistor, and a ground selection transistor connected in series, and the control logic is configured to perform the verification operation on either one of the string selection transistor and the ground selection transistor.

In one embodiment, the control logic is configured to perform the verification operation in response to a command. For example, the command may be a program command, a read command, or a verification command, which indicates to perform the verification operation.

In one embodiment, the control logic is configured to perform the verification operation before an operation associated with the command.

In one embodiment, the control logic is configured to perform the verification operation after an operation associated with the command.

In one embodiment, the control logic is configured to generate a count value indicating a number of times the command is received, and to perform the verification operation if the count value exceeds a reference value.

In one embodiment, wherein reference value is randomly generated.

In one embodiment, the control logic is configured to perform the verification operation for at least one currently programmed memory string in a memory cluster which was most recently access based on the command.

In one embodiment, the control logic is configured to generate a count value indicating a number of times the command is received for a memory cluster including the currently programmed memory string, and to perform the verification operation if the count value exceeds a reference value.

In one embodiment, the memory cluster is one of a memory string, a block including at least one memory string, and a chip.

In one embodiment, the memory system further includes a memory device including the memory array and the control logic.

In one embodiment, the memory system further includes a memory controller configured to send the command.

In another embodiment, the memory system includes a memory device including the memory array, and a memory controller including the control logic.

In one embodiment, the control logic is configured to receive the command from a host.

In one embodiment, the control logic is configured to perform the verification operation based on a wear level of a memory cluster including the currently programmed memory string.

In one embodiment, the control logic is configured to store a result of the determining.

In one embodiment, the control logic is configured to determine whether a memory cluster is bad based on a number of memory strings in the memory cluster determined to fail the verification operation, and to prohibit access to the memory cluster if the determining determines the memory cluster is bad.

In one embodiment, the memory array is three dimensional.

BRIEF DESCRIPTION OF THE FIGURES

Example embodiments of the inventive concepts will be described below in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF EXAMPLE EMBODIMENTS

Figure 1:
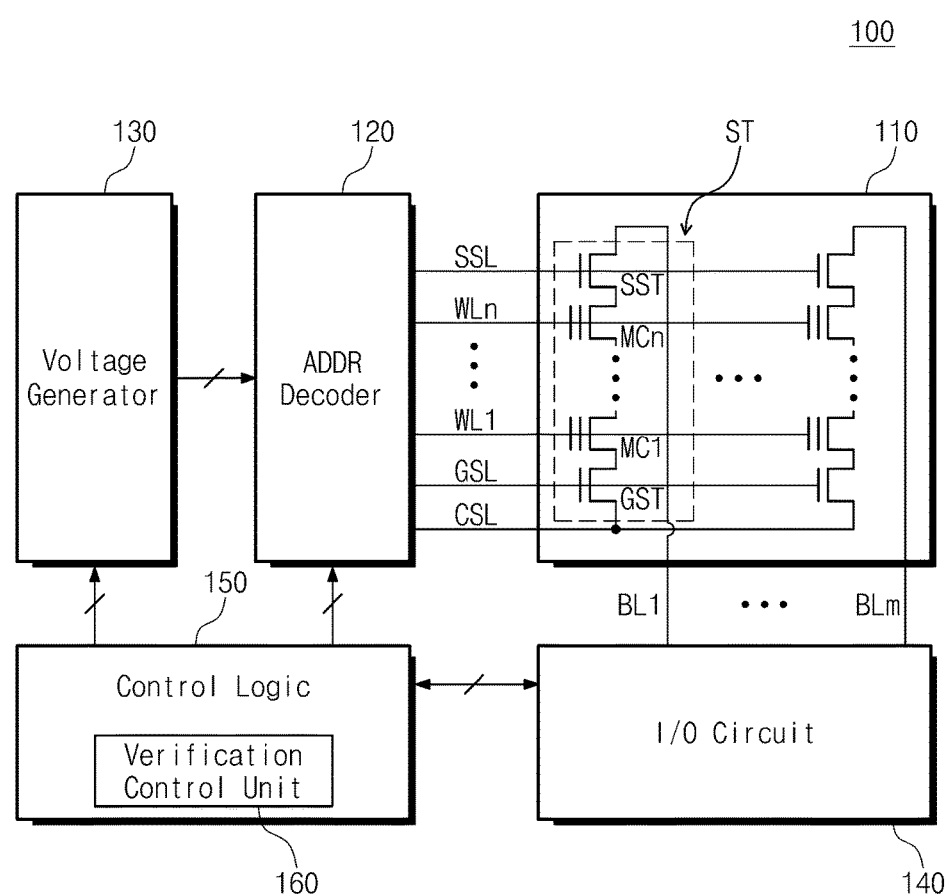
FIG. 1 is a block diagram illustrating a nonvolatile memory device in accordance with an example embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concepts of the inventive concepts to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

For explanation purposes, it is assumed that a nonvolatile memory device of the inventive concepts is a NAND flash memory device. However, this is only an illustration and the type of a nonvolatile memory device of the inventive concepts is not limited to a NAND flash memory device.

For example, a nonvolatile memory device may be a NAND flash memory, a vertical NAND flash memory (VNAND), a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), etc. A nonvolatile memory device may have a three-dimensional array structure. The inventive concepts can be applied to not only a flash memory device having a charge storage layer constituted by a conductive floating gate but also a charge trap flash (CTF) having a charge storage layer constituted by an insulating layer.

FIG. 1 is a block diagram illustrating a nonvolatile memory device in accordance with an example embodiment of the inventive concepts. Referring to FIG. 1, a nonvolatile memory device 100 includes a memory cell array 110, an address decoder 120, a voltage generator 130, an input/output circuit 140 and control logic 150.

In response to a command from the outside or when it is judged that a selection transistor is to be verified, the nonvolatile memory device 100 verifies the selection transistor to detect deterioration of the selection transistor. The nonvolatile memory device 100 can guarantee reliability of stored data using a verify operation of the selection transistor.

The memory cell array 110 includes a plurality of memory blocks. In FIG. 1, for the purposes of clarity only, a single memory block is illustrated. However, it will be understood that the memory array 110 may include a plurality of memory blocks. The memory block includes at least one string ST connected to a plurality of bit lines BL1~BLm respectively.

The string ST includes at least one ground selection transistor, a plurality of memory cells MC1~MCn and at least one string selection transistor connected in series between a corresponding common source line CSL and a corresponding bit line BL (for example, BL1).

The ground selection transistor GST and the string selection transistor SST are driven by voltages being transmitted through a ground selection line GSL and a string selection line SSL.

Each of the memory cells MC1~MCn stores data of at least one bit. The memory cells MC1~MCn are driven by voltages being transmitted through corresponding word lines WL1~WLn.

The address decoder 120 selects any one of a plurality of memory blocks in response to an address. The address decoder 120 transmits word line voltages (for example, a program voltage, a pass voltage, an erase voltage, a verification voltage, a read voltage, a read pass voltage, etc.) for driving the nonvolatile memory device 100 to corresponding word lines.

The voltage generator 130 generates word line voltages for driving the nonvolatile memory device 100. The voltage generator 130 may include a high voltage generator to generate a high voltage, a low voltage generator to generate a low voltage and a negative voltage generator to generate a negative voltage.

The input/output circuit 140 temporarily stores data input from the outside when a program operation is performed and loads the stored data into a page to be written. The input/output circuit 140 reads data from a corresponding page when a read operation is performed to temporarily store the data and then output the stored data to the outside. The input/output circuit 140 may include page buffers corresponding to respective bit lines BL1~BLm. Each page buffer may include at least one latch that temporarily stores data to be programmed in a memory cell connected to a corresponding bit line or temporarily stores data read from a memory cell connected to a corresponding bit line.

The control logic 150 (e.g., a hardware circuit, a firmware circuit, a special purpose processor, etc.) controls the whole operation of the nonvolatile memory device 100. The control logic 150 decodes control signals and a command provided from the outside. The control logic 150 controls the address decoder 120, the voltage generator 130 and the input/output circuit 140 in response to a decoding result. That is, the control logic 150 controls the voltage generator 130 to generate voltages (for example, program/read/erase operation) needed to drive the nonvolatile memory device 100, controls the address decoder 120 so that the generated voltages are transmitted to word lines WL1~WLn and controls the input/output circuit 140 to input and output page data to be programmed and page data read.

The control logic 150 includes a verification control unit 160. The verification control unit 160 controls a verify operation of a selection transistor verifying a threshold voltage of selection transistors SST and GST of the memory cell array 110.

The verification control unit 160 can perform a verify operation of a selection transistor in response to a command input from the outside. The verification control unit 160 can also perform a verify operation of a selection transistor to verify a threshold voltage of the selection transistors SST and GST when a wear level of the selection transistors SST and GST reaches a desired (or, alternatively a predetermined) condition and thereby it is judged that the selection transistors SST and GST are to be verified. A verify operation entry condition of the selection transistor of the verification control unit 160 will be described in further detail with reference to FIGS. 2 through 5.

The verification control unit 160 can perform a verify operation on a plurality of selection transistors connected to a desired (or, alternatively a predetermined) selection line (for example, a string selection line). If the number of selection transistors determined to be deteriorated among the selection transistors connected to a selected desired (or, alternatively a predetermined) selection line exceeds a desired (or, alternatively a predetermined) reference value, the verification control unit 160 can determine the selection line on which a verify operation is performed to be bad.

The verification control unit 160 can determine a memory cluster including a bad selection line to be bad. A memory cluster may be a unit by which a verify operation of the selection transistor is performed by the verification control unit 160. For example, the memory cluster may be at least a memory string, memory block or memory chip.

The control logic 150 can copy data stored in the memory cluster determined to be bad to another memory cluster and can process the memory cluster determined to be bad to be unavailable.

In response to a command from the outside or when it is judged that a selection transistor is to be verified, the nonvolatile memory device 100 verifies the selection transistor to detect deterioration of the selection transistor. The nonvolatile memory device 100 can guarantee reliability of stored data using a verify operation of the selection transistor.

Figure 2:
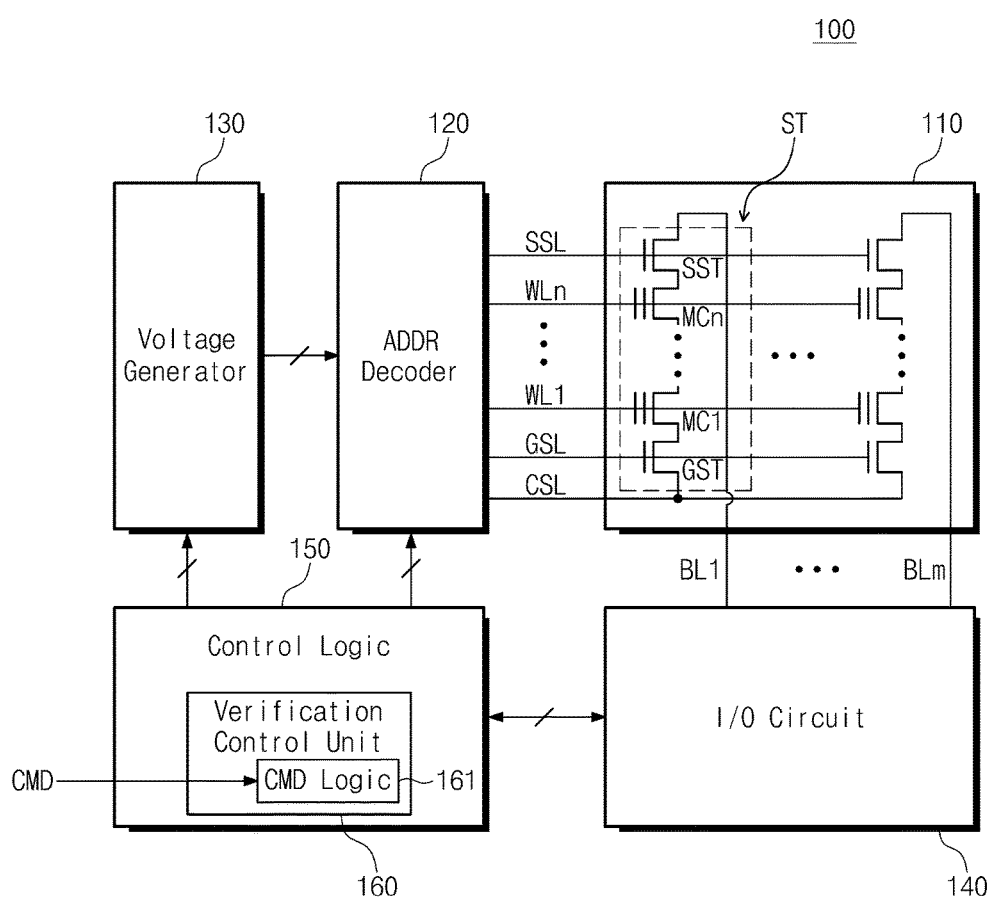
FIG. 2 is a block diagram illustrating an embodiment of a nonvolatile memory device of FIG. 1.

FIG. 2 is a block diagram illustrating an embodiment of a nonvolatile memory device of FIG. 1. Referring to FIG. 2, the verification control unit 160 of the nonvolatile memory device 100 includes command logic 161.

The command logic 161 decodes a command provided from the outside, for example, from a memory controller. The command logic 161 controls a peripheral circuit (e.g., the memory cell array 110, the address decoder 120, the voltage generator 130 and the input/output circuit 140) of the nonvolatile memory device so that a verify operation of the selection transistor is performed in response to the decoded command.

The command logic 161 may control the nonvolatile memory device so that a verify operation of the selection transistor is performed in response to a program command or a read command provided from the outside.

The command logic 161 may control the nonvolatile memory device so that a verify operation of the selection transistor is performed before an operation corresponding to the inputted command is performed. For example, if the command logic 161 receives a read command, the command logic 161 may control the nonvolatile memory device so that a verify operation of the selection transistor is performed before a read operation is performed on the memory cell array 110.

The command logic 161 may control the nonvolatile memory device after an operation corresponding to the inputted command is performed. For example, if the command logic 161 receives a program command, the command logic 161 may control the nonvolatile memory device so that a verify operation of the selection transistor is performed before a program operation is performed on the memory cell array 110.

The command logic 161 may control the nonvolatile memory device so that a verify operation of the selection transistor is performed in response to a verification command of the selection transistor provided from the outside. The verification command of the selection transistor may be a command defined between the outside, for example, a memory controller (or, alternatively a host device) and the control logic 150 to direct a verify operation of the selection transistor.

The nonvolatile memory device 100 decodes a command provided from the outside and can perform a verify operation of the selection transistor in response to the decoded command. The nonvolatile memory device 100 can guarantee reliability of stored data using the verify operation of the selection transistor.

Still further, the command logic 161 may control the non-volatile memory device to perform the verify operation in parallel with performing functions in response to the command.

Figure 3:
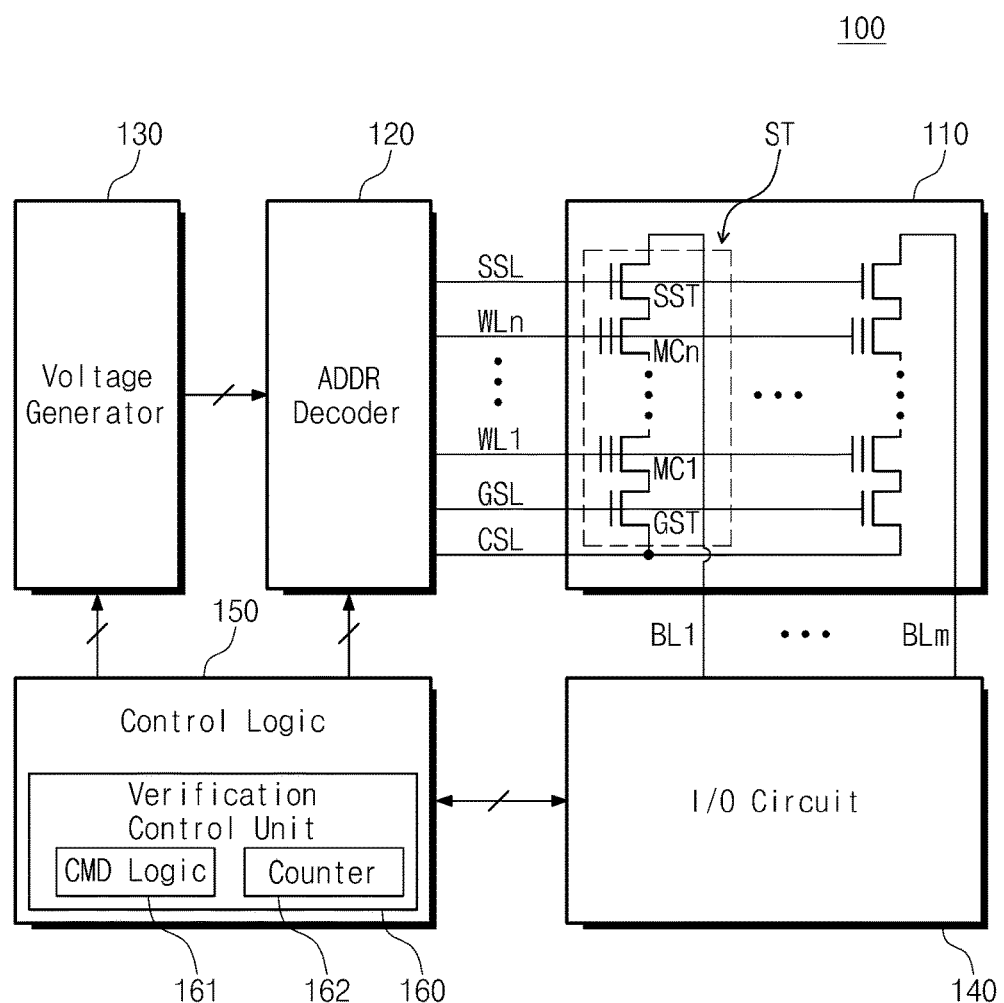
FIG. 3 is a block diagram illustrating another embodiment of a nonvolatile memory device of FIG. 1.

FIG. 3 is a block diagram illustrating another embodiment of a nonvolatile memory device of FIG. 1. Referring to FIG. 3, the verification control unit 160 includes the command logic 161 and a counter 162.

The command logic 161 decodes a command provided from the outside, for example, a memory controller (or, alternatively a host device). The command logic 161 may control the nonvolatile memory device (e.g., the memory cell array 110, the address decoder 120, the voltage generator 130 and the input/output circuit 140) so that a verify operation of the selection transistor is performed in response to the decoded command.

In one embodiment, the command logic 161 may count a command provided from the outside using the counter 162. If a desired (or, alternatively a predetermined) command is provided from the outside, the counter 162 may increase a count value in response to the command. For example, the counter 162 may increase a count value every time a read command is provided from the outside. As an alternative, the counter 162 may increase a count value every time a program command is provided from the outside.

If a count value reaches a desired (or, alternatively a predetermined) reference value, the command logic 161 may control the nonvolatile memory device so that a verify operation of the selection transistor is performed.

The nonvolatile memory device 100 counts the number of times a command is received from the outside and performs a verify operation of the selection transistor in response to a count result. In this way, the nonvolatile memory device 100 may improve or guarantee reliability of stored data using the verify operation of the selection transistor.

Figure 4:
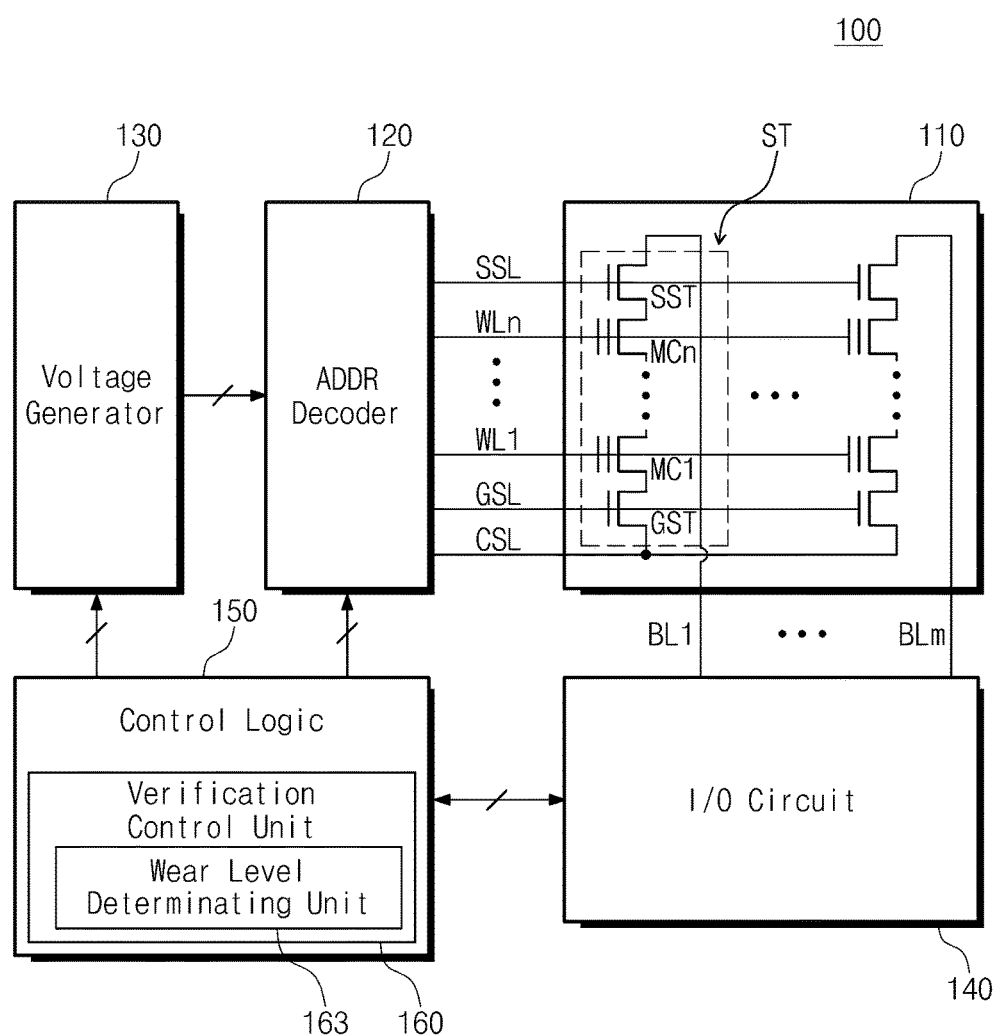
FIG. 4 is a block diagram illustrating still another embodiment of a nonvolatile memory device of FIG. 1.

FIG. 4 is a block diagram illustrating still another embodiment of a nonvolatile memory device of FIG. 1. Referring to FIG. 4, the verification control unit 160 includes a wear level determination unit 163. The wear level determination unit 163 determines a wear level of a selection transistor included in the memory cell array 110. If the determined wear level exceeds a desired (or, alternatively a predetermined) reference value, the wear level determination unit 163 controls the nonvolatile memory device so that a verify operation of the selection transistor is performed.

The wear level determination unit 163 may determine a wear level of the selection transistor on the basis of lapse of time (e.g., life of the nonvolatile memory device). The wear level determination unit 163 may determine a wear level of the selection transistor on the basis of the number of times program and erase (P/E) operations are performed on a memory cluster. For example, if the number of P/E operations for the memory cluster exceed a threshold. However, these are only examples, and a method of determining a wear level of the wear level determination unit 163 is not limited to the embodiments described above.

The nonvolatile memory device 100 includes the wear level determination unit 163 to perform a verify operation of a selection transistor on the basis of a wear level of the selection transistor. In this manner, the nonvolatile memory device 100 may improve or guarantee reliability of stored data using the verify operation of a selection transistor.

Figure 5:
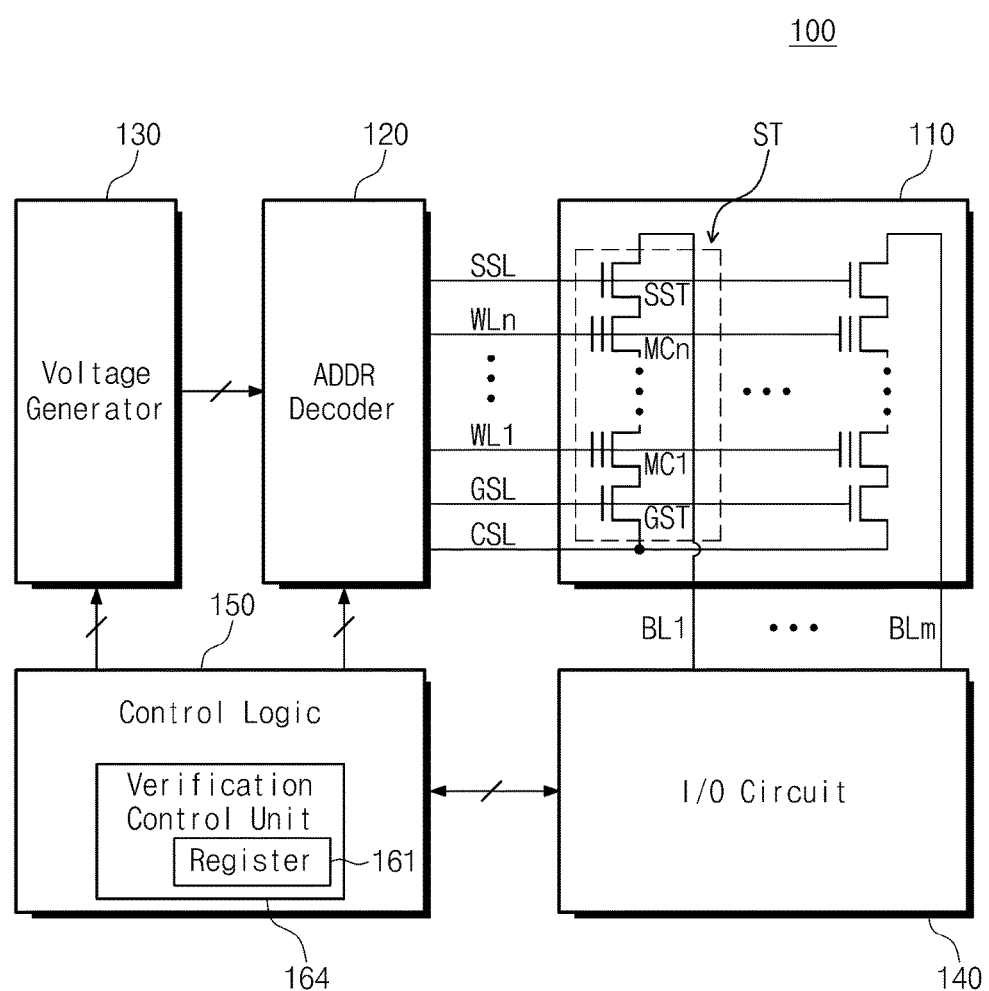
FIG. 5 is a block diagram illustrating yet another embodiment of a nonvolatile memory device of FIG. 1.

FIG. 5 is a block diagram illustrating yet another embodiment of a nonvolatile memory device of FIG. 1. Referring to FIG. 5, the verification control unit 160 includes a register 164.

The verification control unit 160 may store a determination result of a verification operation on a memory cluster in the register 164. The verification control unit 160 can provide the determination result of a memory cluster to the output. The verification control unit 160 can maintain information stored in the register 164 even when the nonvolatile memory device 100 is off.

Figure 6:
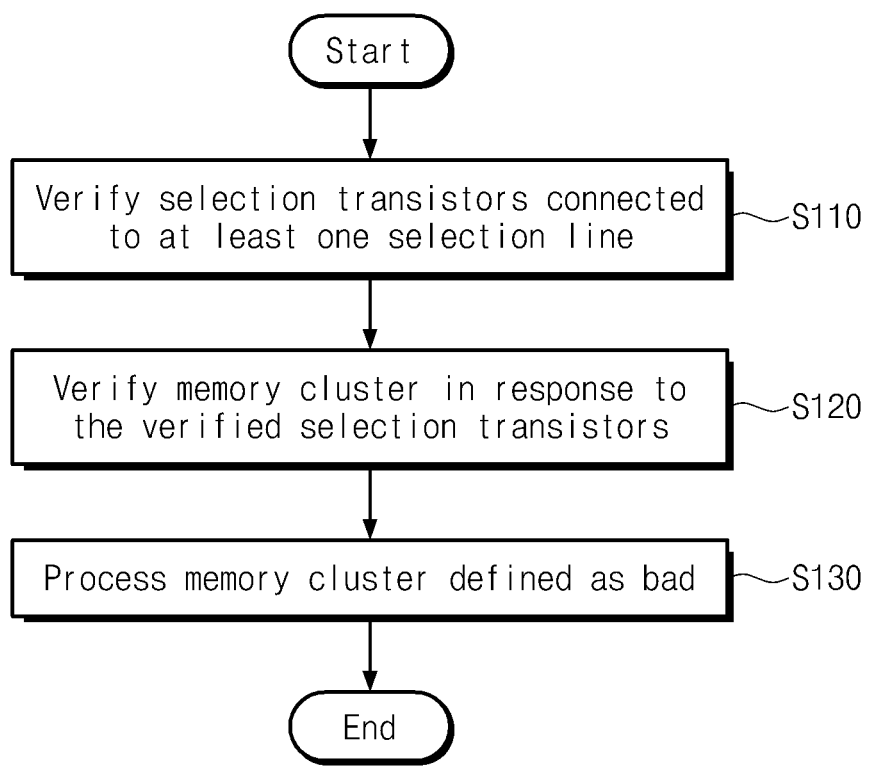
FIG. 6 is a flow chart illustrating a driving method of a nonvolatile memory device in accordance with an example embodiment of the inventive concepts.

FIG. 6 is a flow chart illustrating a driving method of a nonvolatile memory device in accordance with an example embodiment of the inventive concepts. It will be understood that the method is performed by the verification control unit 160. Referring to FIG. 6, a driving method including a verify operation of a selection transistor of the nonvolatile memory device 100 (refer to FIG. 1) is as follows.

In a step S110, a verify operation is performed on selection transistors connected to at least one selection line. A verify operation of the selection transistors is performed based on a threshold voltage of the selection transistors. Selection transistors having a threshold voltage which is out of a desired (or, alternatively a predetermined) voltage range may be determined to be deteriorated.

For example, in one embodiment, a voltage less than that applied during a normal read operation to the selection transistor may be applied. In another embodiment, the applied voltage is less than the voltage applied to the selection transistor during copy back operation such as described below with respect to step S130 and in more detail with respect to FIG. 10. The applied voltage is less than a threshold voltage distribution of the selection transistor if the selection transistor has not deteriorated. Read voltages are also applied to the memory cells. If the selection transistor turns on data will be read out to the I/O circuit 140. The verification control unit 160 receives an indication that the selection transistor has turned on (i.e., that data has been read) from the I/O circuit 140, and in response determines the selection transistor (string selection and/or ground selection) as deteriorated. If no data is read out, the verification control unit 160 receives an indication from the I/O circuit 140 that the selection transistor remained off (i.e., no data has been read), and in response determines that the selection transistor has not deteriorated.

Additionally, or alternatively, during the verification operation, a voltage greater than a normal read voltage may be applied to the selection transistor. In one embodiment, the applied voltage is greater than the voltage applied to the selection transistor during a copy-back operation such as described below with respect to step S130 and in more detail with respect to FIG. 10. The applied voltage is greater than the threshold distribution of the selection transistor, if the selection transistor has not deteriorated. Read voltages are also applied to the memory cells. If the selection transistor turns on data will be read out to the I/O circuit 140. The verification control unit 160 receives an indication that the selection transistor has turned on (i.e., that data has been read) from the I/O circuit 140, and in response determines the selection transistor (string selection and/or ground selection) as deteriorated. If no data is read out, the verification control unit 160 receives an indication from the I/O circuit 140 that the selection transistor has remained off (i.e., that no data has been read), and in response determines that the selection transistor has not deteriorated.

In a step S120, a verify operation is performed on a memory cluster including the selection transistors verified in the step S110. A verification operation of the memory cluster may be performed based on a deterioration degree of the selection transistors included in the memory cluster. For example, if the number of memory strings having a deteriorated selection transistor exceeds a threshold number, the memory cluster is determined to be bad. The threshold number may be an empirically determined design parameter. In one embodiment, the threshold number may be one.

The memory cluster is a memory unit which is determined to be bad and processed. A size of the memory cluster is not limited. For example, the memory cluster may be a memory string including a selection transistor. The memory cluster may also be a memory block including at least one memory string, a memory chip including at least one memory block.

In a step S130, a process operation is performed on a memory cluster determined to be bad. The process operation may include a copy-back operation of data stored in the bad memory cluster and a prohibition operation of use of the bad memory cluster.

According to the driving method of the nonvolatile memory device, the nonvolatile memory device can verify a selection transistor to detect deterioration of the selection transistor. The nonvolatile memory device can improve or guarantee reliability of stored data using the verify operation of the selection transistor.

The verification method of the selection transistor can be applied to a planar NAND and a VNAND, and more particularly, to a single bit line structure or shared bit line structure of a planar NAND and a VNAND.

Figure 7:
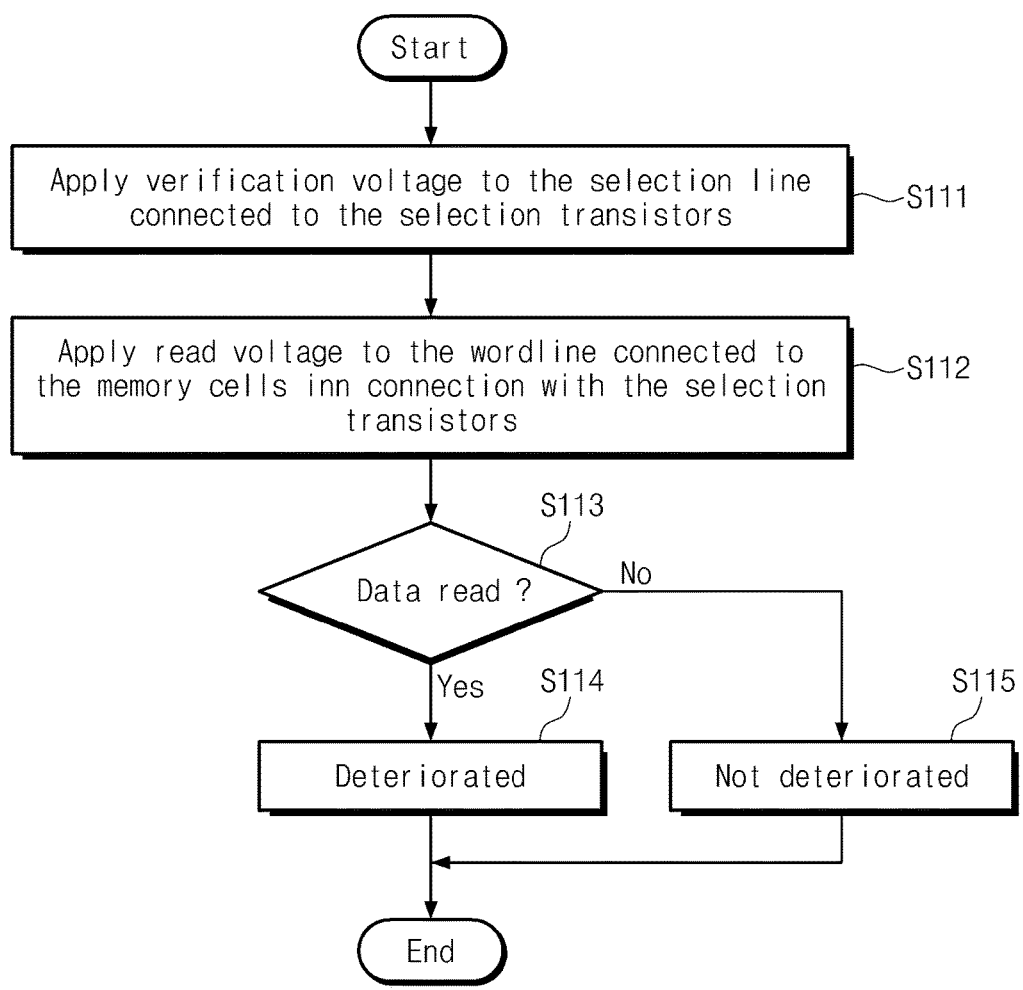
FIG. 7 is a flow chart illustrating an embodiment of a verify operation of a selection transistor of FIG. 6.

FIG. 7 is a flow chart illustrating an embodiment of a verify operation of a selection transistor of FIG. 6. It will be understood that the method is performed by the verification control unit 160.

In a step S111, a desired (or, alternatively a predetermined) verification voltage is provided to a selection line connected to selection transistors to be verified. As described above, the desired (or, alternatively a predetermined) verification voltage being provided to the selection line may be lower than a voltage being applied to the selection line when a conventional read or copy back operation is performed.

In a step S112, a read voltage is provided to word lines connected to memory cells connected to the selection transistors. The memory cells are turned on in response to the read voltage.

In a step S113, the verification control unit 160 determines whether data has been read. If so, in step S114, the verification control unit 160 determines the selection transistor has deteriorated. If no data is read, the verification control unit 160 determines in step S115 that the selection transistor has not deteriorated.

According to the verify operation of the selection transistor described above, the nonvolatile memory device can detect deterioration of the selection transistor using the verification voltage. When a verify operation is performed, the nonvolatile memory device provides a verification voltage lower than a voltage being usually applied to the selection line to more stably perform a verify operation.

Figure 8:
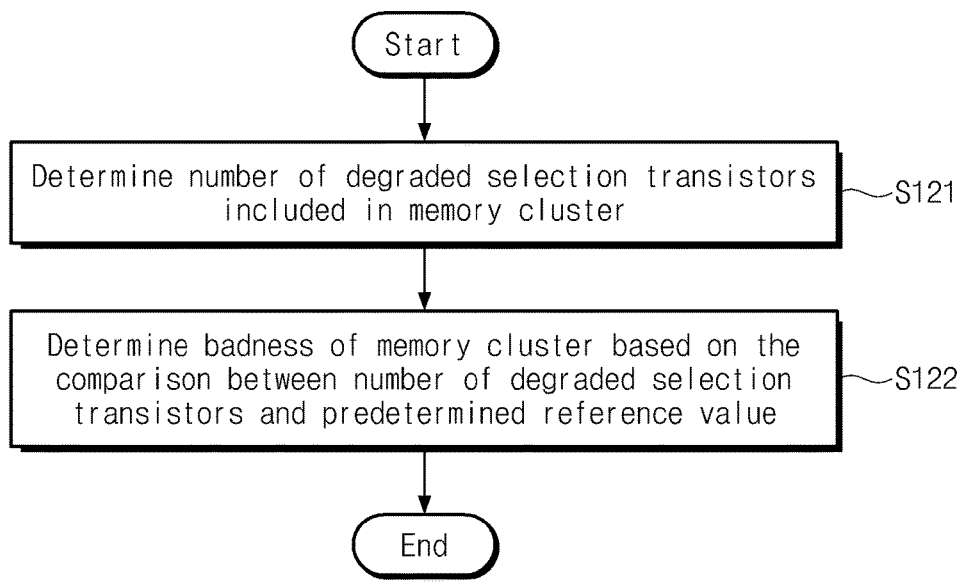
FIG. 8 is a flow chart illustrating an embodiment of a verify operation of a memory cluster of FIG. 6.

FIG. 8 is a flow chart illustrating an embodiment of a verify operation of a memory cluster of FIG. 6. It will be understood that the method is performed by the verification control unit 160.

In a step S121, the number of deteriorated selection transistors included in a memory cluster to be verified is determined.

In a step S122, whether or not the memory cluster is bad is determined based on the number of deteriorated selection transistors determined in the step S121. If the number of deteriorated selection transistors included in the memory cluster exceeds a desired (or, alternatively a predetermined) reference value, the memory cluster may be determined to be bad. If a ratio of deteriorated selection transistors to selection transistors included in the memory cluster exceeds a desired (or, alternatively a predetermined) reference value, the memory cluster may be determined to be bad.

According to the verification method of the memory cluster described above, the nonvolatile memory device can determine the memory cluster to be bad in response to a deterioration degree of selection transistors included in the memory cluster. The nonvolatile memory device can improve or guarantee reliability of stored data using the verify operation of the memory cluster.

Figure 9:
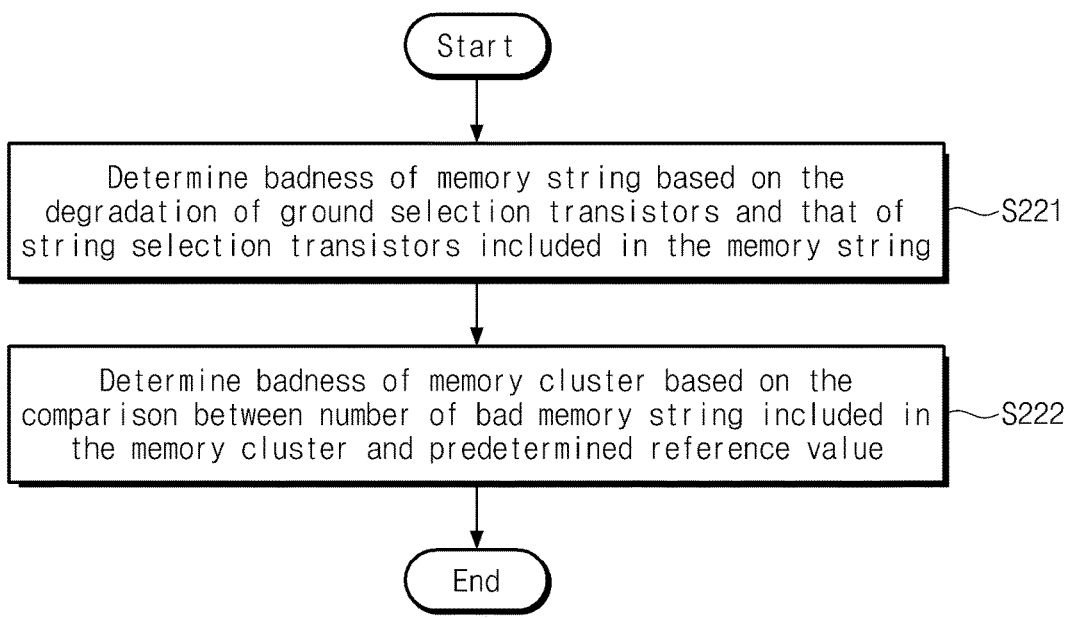
FIG. 9 is a flow chart illustrating another embodiment of a verify operation of a memory cluster of FIG. 6.

FIG. 9 is a flow chart illustrating another embodiment of a verify operation of a memory cluster of FIG. 6. It will be understood that the method is performed by the verification control unit 160.

In a step S221, it is determined whether each memory string included in the memory cluster to be verified is bad or not. Each memory cell includes memory cells connected in series, a ground selection transistor and a string selection transistor.

If at least one of ground selection transistor and string selection transistor included in the memory string is determined to be deteriorated, the memory string may be determined to be bad.

In a step S222, whether or not the memory cluster is bad is determined based on the number of the bad memory strings determined in the step S221. If the number of memory strings determined to be bad included in the memory cluster exceeds a desired (or, alternatively a predetermined) reference value, the memory cluster may be determined to be bad.

In FIG. 9, the memory cluster is verified based on the number of bad memory strings but a technical feature of the inventive concepts is not limited thereto. For example, if the memory cluster is a larger memory unit such as a chip, whether the chip is bad may be determined based on the number of small memory units (e.g., blocks) determined to be bad. If the number of small memory units determined to be bad included in the memory cluster exceeds a desired (or, alternatively a predetermined) reference value, the memory cluster may be determined to be bad.

According to the verification method of the memory cluster described above, the nonvolatile memory device can determine the memory cluster to be bad in response to a deterioration degree of memory small units included in the memory cluster. The nonvolatile memory device can improve or guarantee reliability of stored data using the verify operation of the memory cluster.

Figure 10:
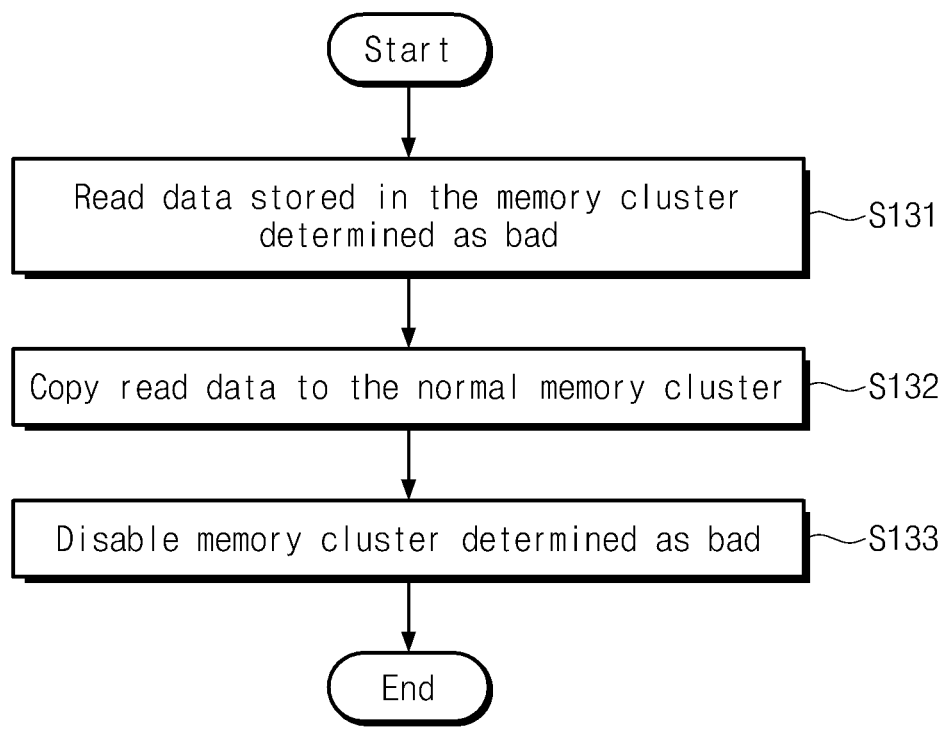
FIG. 10 is a flow chart illustrating an embodiment of a process operation of a bad memory cluster of FIG. 6.

FIG. 10 is a flow chart illustrating an embodiment of a process operation (S130) of a bad memory cluster of FIG. 6. It will be understood that the method is performed by the verification control unit 160.

In a step S131, data stored in a memory cluster determined to be bad is read out. In the process of reading out data, a voltage higher than a voltage being applied in a conventional read operation may be applied to selection lines connected to selection transistors included in the memory cluster. The data read out may be stored in a buffer memory.

In a step S132, data read out from the memory cluster is copied to a normal memory cluster.

In a step S133, a use of a memory cluster determined to be bad is prohibited. Bad determination information of the memory cluster may be stored in a register of the control logic 150. The bad determination information of the memory cluster may also be provided to the outside.

It is not required to sequentially perform the steps S131 through S133. For example, a prohibition on using the memory cluster of step 133 may be performed, and then a data read out operation of the memory cluster of the step S131 may be performed.

According to the driving method of the nonvolatile memory device described above, the nonvolatile memory device can verify a selection transistor to detect deterioration of the selection transistor. The nonvolatile memory device can improve or guarantee reliability of stored data using the verify operation of the selection transistor.

The verification method of the selection transistor can be applied to a planar NAND and a VNAND, and more particularly, to a single bit line structure or shared bit line structure of a planar NAND and a VNAND.

Figure 11:
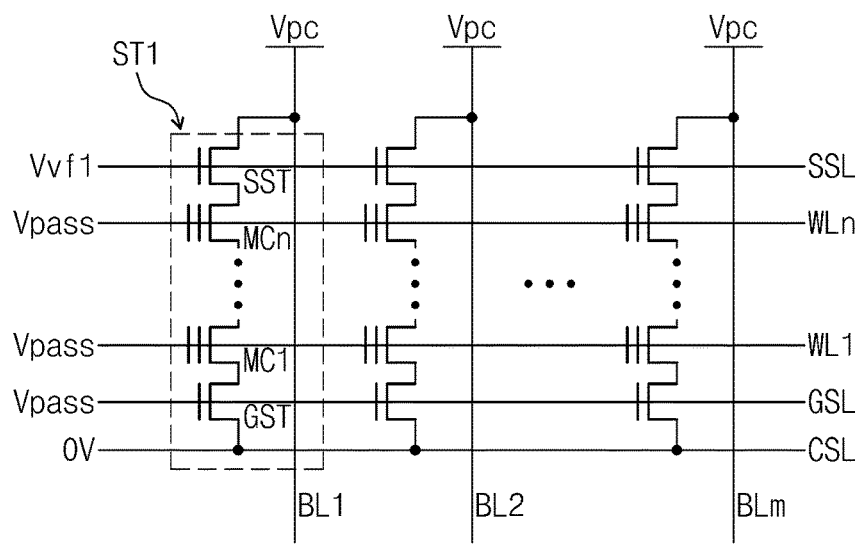
FIG. 11 is a drawing for illustrating an embodiment of a method of verifying a selection transistor in accordance with the inventive concepts.

FIG. 11 is a drawing for illustrating an embodiment of a method of verifying a selection transistor in accordance with the inventive concepts. Referring to FIG. 11, a verify operation is performed on string selection transistors connected to the string selection line SSL. For explanation purposes, in FIG. 11, an operation of verifying a string selection transistor SST included in a first string ST1 is illustrated.

In FIG. 11, the string selection transistor SST is illustrated by a conventional transistor but a technical feature of the inventive concepts is not limited thereto. For example, the string selection transistor SST may have the same structure as memory cells MC1~MCn and may have one or more selection gates.

A precharge voltage Vpc is provided to a bit line BL1 connected to the string selection transistor SST to be verified. A first verification voltage Vvf1 is provided to a string selection line SSL connected to a gate of the string selection transistor SST. A pass voltage Vpass is provided to word lines WL1~WLn and a ground selection line GSL connected to memory cells MC1~MCn and a ground selection transistor GST respectively that are serially connected to the string selection transistor SST. A ground voltage is provided to a common source line CSL.

The first verification voltage Vvf1 may be lower than a voltage being applied to the string selection transistor SST in a conventional read operation or during a copy-back operation. Using the provided first verification voltage Vvf1, if data is readout, the string selection transistor SST may be determined to be turned on and deteriorated.

The first verification voltage Vvf1 may be higher than a voltage being applied to the string selection transistor SST in a conventional read operation or during a copy-back operation. Using the provided first verification voltage Vvf1, if data is readout, the string selection transistor SST may be determined to be turned on and deteriorated.

In FIG. 11, the nonvolatile memory device has an all bit line (ABL) structure that a precharge voltage is applied to all bit lines BL1~BLm but a technical feature of the inventive concepts is not limited thereto. For example, the nonvolatile memory device may have an even-odd structure.

In addition, the nonvolatile memory device can select only bit lines corresponding to selection transistors to be verified among the bit lines BL1~BLm to precharge the bit lines instead of applying a precharge voltage to all the bit lines BL1~BLm. In this case, a ground voltage, for example, 0V, is provided to unselected bit lines.

Figure 12:
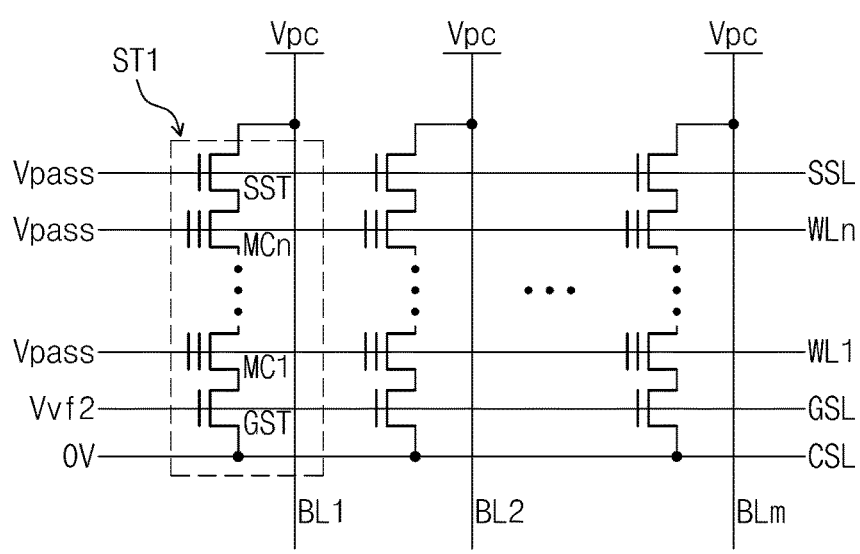
FIG. 12 is a drawing for illustrating another embodiment of a method of verifying a selection transistor in accordance with the inventive concepts.

FIG. 12 is a drawing for illustrating another embodiment of a method of verifying a selection transistor in accordance with the inventive concepts. Referring to FIG. 12, a verify operation is performed on ground selection transistors connected to a ground selection line GSL. For explanation purposes, in FIG. 12, an operation of verifying the ground selection transistor GST included in a first string ST1 is illustrated.

In FIG. 12, the ground selection transistor GST is illustrated by a conventional transistor but a technical feature of the inventive concepts is not limited thereto. For example, the ground selection transistor GST may have the same structure as memory cells MC1~MCn and may have one or more selection gates.

A precharge voltage Vpc is provided to a bit line BL1 connected to the ground selection transistor GST to be verified. A second verification voltage Vvf2 is provided to a ground selection line GSL connected to a gate of the ground selection transistor GST. A pass voltage Vpass is provided to word lines WL1~WLn and a string selection line SSL connected to memory cells MC1~MCn and a string selection transistor SST respectively that are serially connected to the ground selection transistor GST. A ground voltage is provided to a common source line CSL.

The second verification voltage Vvf2 may be lower than a voltage being applied to the ground selection transistor GST in a conventional read operation or during a copy-back operation. Using the provided second verification voltage Vvf2, if data is readout, the ground selection transistor GST may be determined to be turned on and deteriorated.

The second verification voltage Vvf2 may be higher than a voltage being applied to the ground selection transistor GST in a conventional read operation or during a copy-back operation. Using the provided second verification voltage Vvf2, if data is readout, the ground selection transistor GST may be determined to be turned on and deteriorated.

In FIG. 12, the nonvolatile memory device has an all bit line (ABL) structure that a precharge voltage is applied to all bit lines BL1~BLm but a technical feature of the inventive concept is not limited thereto. For example, the nonvolatile memory device may have an even-odd structure.

In addition, the nonvolatile memory device can select only bit lines corresponding to selection transistors to be verified to precharge the bit lines. In this case, a ground voltage, for example, 0V, is provided to unselected bit lines.

Figure 13:
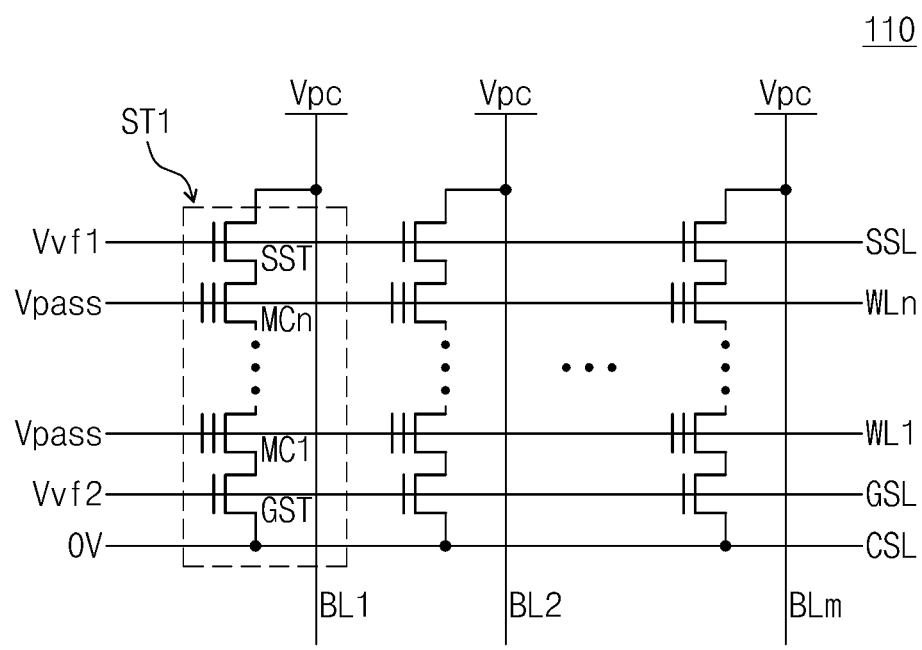
FIG. 13 is a drawing for illustrating still another embodiment of a method of verifying a selection transistor in accordance with the inventive concepts.

FIG. 13 is a drawing for illustrating still another embodiment of a method of verifying a selection transistor in accordance with the inventive concept. Referring to FIG. 13, a verify operation is simultaneously performed on string selection transistors connected to a string selection line SSL and ground selection transistors connected to a ground selection line GSL. For explanation purposes, in FIG. 13, an operation of verifying the string selection transistor SST and the ground selection transistor GST included in a first string ST1 is illustrated.

A precharge voltage Vpc is provided to a bit line BL1 connected to the string selection transistor SST to be verified. A first verification voltage Vvf1 is provided to a string selection line SSL connected to a gate of the string selection transistor SST. A second verification voltage Vvf2 is provided to a ground selection line GSL connected to a gate of the ground selection transistor GST.

A pass voltage Vpass is provided to word lines WL1~WLn connected to memory cells MC1~MCn connected in series between the string selection transistor SST and the ground selection transistor GST. A ground voltage is provided to a common source line CSL.

The first verification voltage Vvf1 and the second verification voltage Vvf2 may be lower than a voltage being applied to the string selection transistor SST and the ground selection transistor GST in a conventional read operation or during a copy-back operation. Using the provided first and second verification voltages Vvf1 and Vvf2, if data is readout, the string selection transistor SST or the ground selection transistor GST may be determined to be turned on and deteriorated.

The first verification voltage Vvf1 and the second verification voltage Vvf2 may be higher than a voltage being applied to the string selection transistor SST and the ground selection transistor GST in a conventional read operation or during a copy-back operation. Using the provided first and second verification voltages Vvf1 and Vvf2, if data is readout, the string selection transistor SST or the ground selection transistor GST may be determined to be turned on and deteriorated.

Figure 14:
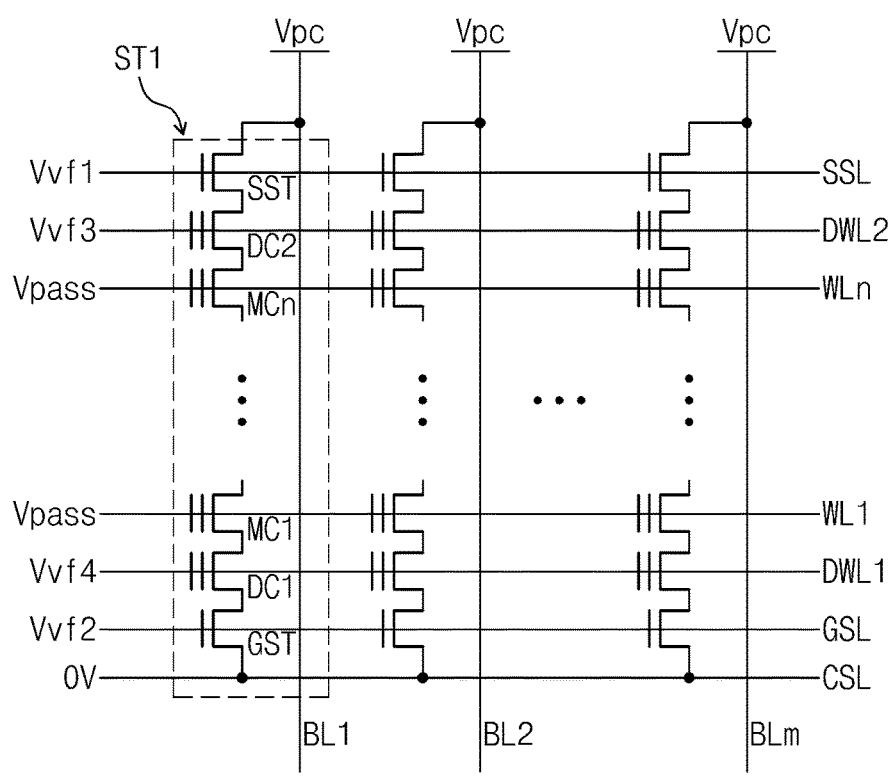
FIG. 14 is a drawing for illustrating yet another embodiment of a method of verifying a selection transistor in accordance with the inventive concepts.

FIG. 14 is a drawing for illustrating yet another embodiment of a method of verifying a selection transistor in accordance with the inventive concept. Referring to FIG. 14, a verify operation is simultaneously performed on string selection transistors connected to a string selection line SSL and ground selection transistors connected to a ground selection line GSL.

In addition, referring to FIG. 14, a verify operation is performed on dummy cells disposed between the selection transistors and memory cells. For explanation purposes, in FIG. 14, an operation of verifying a string selection transistor SST, a ground selection transistor GST, and first and second dummy cells DC1 and DC2 that are included in a first string ST1 is illustrated.

In the first string ST1 of FIG. 14, only first and second dummy cells DC1 and DC2 are illustrated but a technical feature of the inventive concepts is not limited thereto. In a verify operation of the inventive concept, more memory cells among memory cells included in the first string ST1 can be used as a dummy cell.

A precharge voltage Vpc is provided to a bit line BL1 connected to the string selection transistor SST to be verified. A first verification voltage Vvf1 is provided to a string selection line SSL connected to a gate of the string selection transistor SST. A second verification voltage Vvf2 is provided to a ground selection line GSL connected to a gate of the ground selection transistor GST. A third verification voltage Vvf3 is provided to a first dummy word line DWL1 connected to a first dummy cell DC1 connected in series between the ground selection transistor GST and memory cells MC1~MCn. A fourth verification voltage Vvf4 is provided to a second dummy word line DWL2 connected to a second dummy cell DC2 connected in series between the string selection transistor SST and the memory cells MC1~MCn.

A pass voltage Vpass is provided to word lines WL1~WLn connected to the memory cells MC1~MCn connected in series between the string selection transistor SST and the ground selection transistor GST. A ground voltage is provided to a common source line CSL.

The first through fourth verification voltages Vvf1~Vvf4 may be lower than a voltage being applied to the string selection transistor SST, the ground selection transistor GST, and the first and second dummy cells DC1 and DC2 in a conventional read operation or during a copy-back operation. Using the provided first through fourth verification voltages Vvf1~Vvf4, if data is readout, the string selection transistor SST, the ground selection transistor GST, and the first and second dummy cells DC1 and DC2 may be determined to be turned on and deteriorated.

The first through fourth verification voltages Vvf1~Vvf4 may be higher than a voltage being applied to the string selection transistor SST, the ground selection transistor GST, and the first and second dummy cells DC1 and DC2 in a conventional read operation or during a copy-back operation. Using the provided first through fourth verification voltages Vvf1~Vvf4, if data is readout, the string selection transistor SST, the ground selection transistor GST, and the first and second dummy cells DC1 and DC2 may be determined to be turned on and deteriorated.

The verify operation of a selection transistor in accordance with the inventive concepts can be applied to a VNAND.

Figure 15:
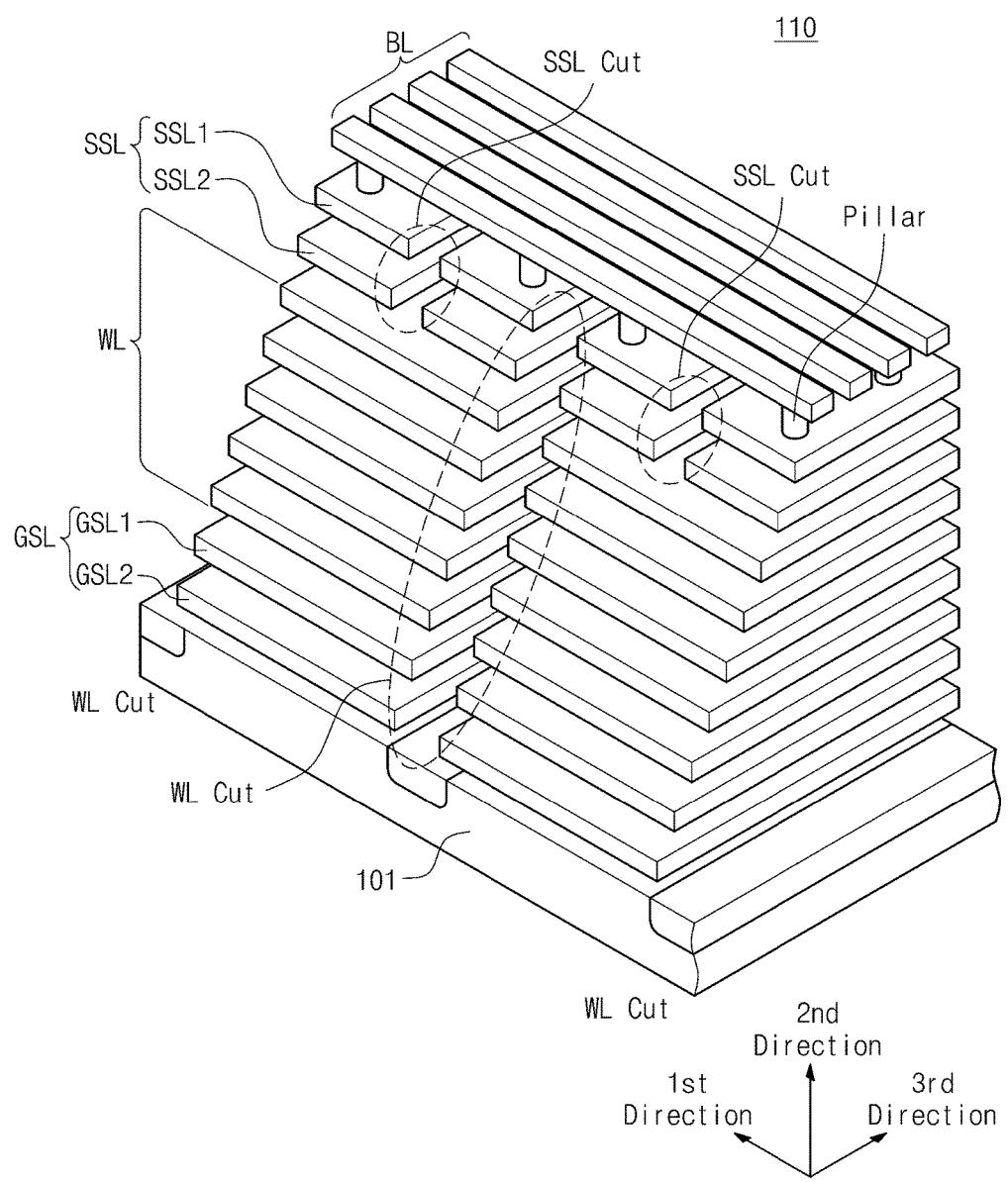
FIG. 15 is a perspective view illustrating a memory block of a VNAND in accordance with the inventive concepts.

FIG. 15 is a perspective view illustrating a memory block of a VNAND in accordance with the inventive concept. Referring to FIG. 15, a memory block 110 is embodied by a word line merged structure. Two ground selection lines GSL1 and GSL2, a plurality of word lines WLs and two string selection lines SSL1 and SSL2 are stacked between word line cuts WL located on a substrate 101. The string selection lines SSL1 and SSL2 can be divided by a string selection line cut (SSL cut).

A plurality of pillars penetrates the ground selection lines GSL1 and GSL2, the word lines WLs and the string selection lines SSL1 and SSL2. The ground selection lines GSL1 and GSL2, the word lines WLs and at least one string selection line SSL can be embodied in the substrate form. Bit lines BLs may be connected to top surfaces of the pillars.

In FIG. 15, the string selection line SSL is embodied in a two-substrate form but a technical spirit of the inventive concepts is not limited thereto. The string selection line SSL can be embodied in at least one substrate form. The ground selection line GSL is embodied in a two-substrate form but a technical spirit of the inventive concept is not limited thereto. The ground selection line GSL can be embodied in at least one substrate form.

In addition, the memory block 110 of FIG. 15 has a word line merged structure but the inventive concept is not limited thereto.

A selection transistor (a part of pillar, not shown) corresponding to at least one of selection lines SSL and GSL in accordance with embodiments of the inventive concepts can be verified by the verify operation of selection transistor described with reference to FIGS. 6 through 14.

Figure 16:
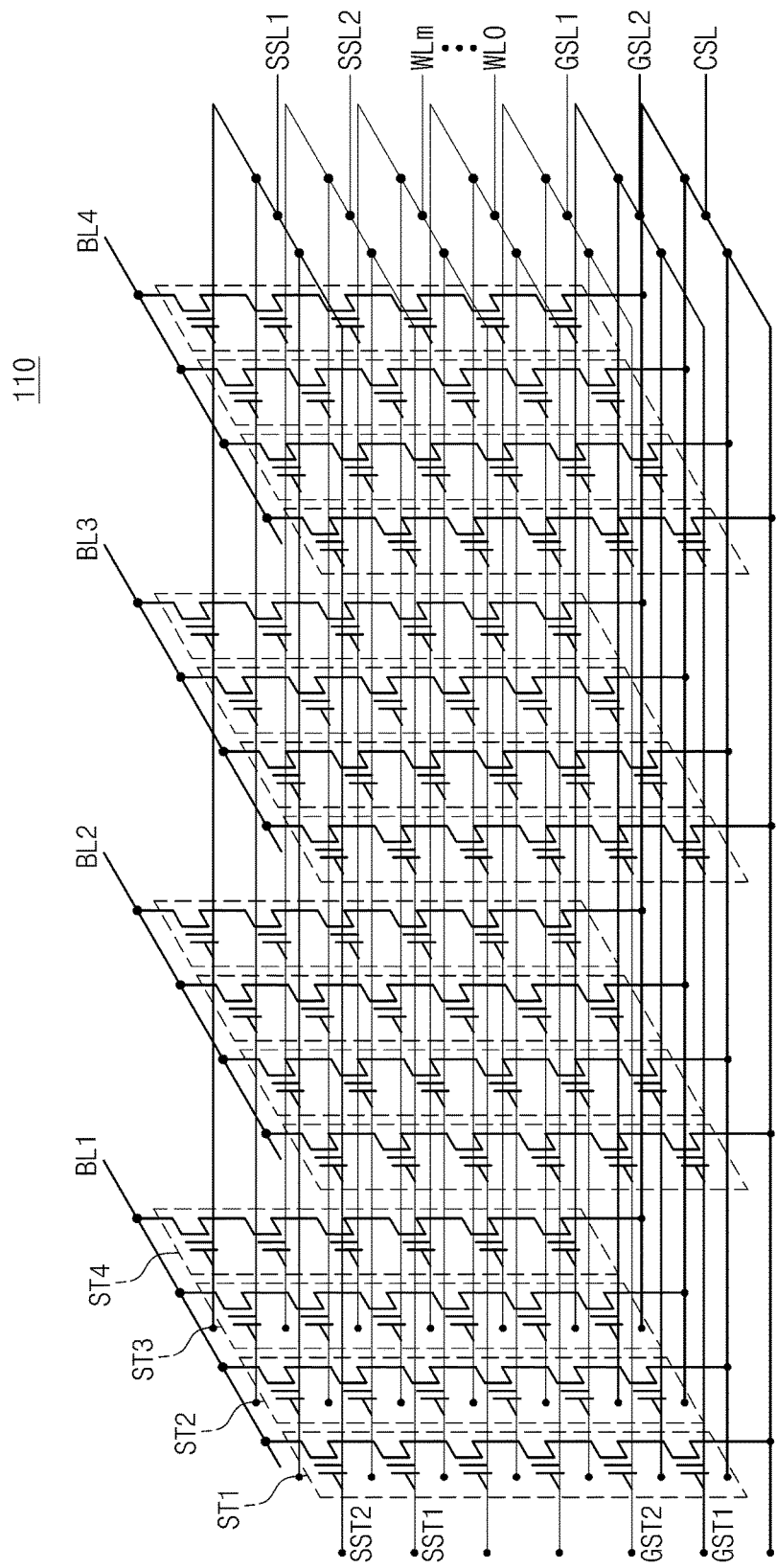
FIG. 16 is a drawing illustrating a circuit diagram of a memory block illustrated in FIG. 15.

FIG. 16 is a drawing illustrating a circuit diagram of a memory block illustrated in FIG. 15. Referring to FIGS. 15 and 16, the memory block 110 has a shared bit line structure. For example, four strings ST1~ST4 connected a first bit line are included between the first bit line BL1 and a common source line CSL. The first bit line BL1 corresponds to conductive material which extended in a first direction.

Each of the strings ST1~ST4 includes two string selection transistors SST1 and SST2 connected in series and the string selection transistors SST1 and SST2 are connected to string selection lines SSL1 and SSL2 respectively. At least one of the string selection transistors SST1 and SST2 can be verified by the verify operation of selection transistor described with reference to FIGS. 6 through 14.

Each of the strings ST1~ST4 includes two ground selection transistors GST1 and GST2 connected in series and the ground selection transistors GST1 and GST2 are connected to ground selection lines GSL1 and GSL2 respectively. At least one of the ground selection transistors GST1 and GST2 can be verified by the verify operation of selection transistor described with reference to FIGS. 6 through 14.

Figure 17:
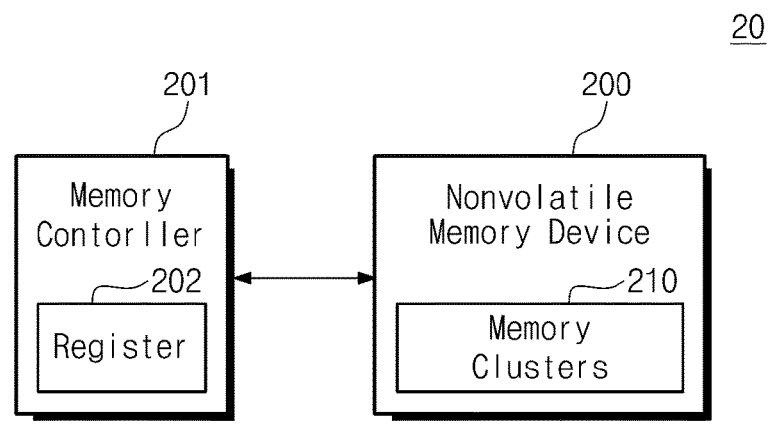
FIG. 17 is a block diagram illustrating a memory system in accordance with an embodiment of the inventive concepts.

FIG. 17 is a block diagram illustrating a memory system 20 in accordance with an embodiment of the inventive concepts. Referring to FIG. 17, the memory system 20 includes a nonvolatile memory device 200 and a memory controller 201.

In response to a command being provided from a host, the memory system 20 can verify a selection transistor of the nonvolatile memory device 200 to detect deterioration of the selection transistor. The memory system 20 can improve or guarantee reliability of data stored in the nonvolatile memory device 200 using the verify operation of selection transistor.

The memory controller 201 controls a data processing operation of the nonvolatile memory device 200 in response to the command provided from the host. For example, the memory controller 201 can provide data stored in the nonvolatile memory device 200 to the host in response to a read command. The memory controller 201 can store data provided from the host in the nonvolatile memory device 200 in response to a program command. An operation of the memory system 20 will be described in further detail with reference to FIG. 17.

The memory controller 201 can perform a verify operation of a selection transistor on the nonvolatile memory device 200 in response to a command provided from the host.

The memory controller 201 can perform a verify operation of a selection transistor on the nonvolatile memory device 200 in response to a desired (or, alternatively a predetermined) verification command of a selection transistor defined between the host and the memory system 20. The verification command of a selection transistor can be provided during an idle time of the nonvolatile memory device.

The verification command of a selection transistor can be provided in response to a count value of a desired (or, alternatively a predetermined) command being provided from the host to the memory system 20. For example, the verification command of a selection transistor can be provided when the number of counts with respect to a read command provided from the host to the memory system 20 reaches a desired (or, alternatively a predetermined) reference value.

The memory controller 201 can control the nonvolatile memory device 200 in response to the verification command of a selection transistor so that the verify operation of a selection transistor described with reference to FIGS. 6 through 14 is performed on the whole nonvolatile memory device 200. The memory controller 201 can control the nonvolatile memory device 200 so that the verify operation of a selection transistor is performed on at least one memory cluster among a plurality of memory clusters 210 included in the nonvolatile memory device 200.

A unit of a memory cluster is not limited. For example, a memory cluster may be a memory string including a selection transistor. The memory cluster may also be a block including at least one memory string, or a memory chip including at least one memory block.

The memory controller 201 can control a nonvolatile memory device 200 so that a verify operation of a selection transistor is performed on a memory cluster which is most recently accessed among the memory clusters 210. However, this is only an illustration and a selection method of a memory cluster of the memory controller 201 is not limited. For example, the memory controller 201 can control the nonvolatile memory device 200 so that a verify operation of a selection transistor is performed on a memory cluster selected by the host.

The memory controller 201 can perform a verify operation of a selection transistor on the nonvolatile memory device 200 in response to a read command provided from the host. The memory controller 201 can perform a verify operation of a selection transistor before data stored in the nonvolatile memory device 200 is read out in response to the read command. The memory controller 201 can perform a verify operation of a selection transistor after data stored in the nonvolatile memory device 200 is read out in response to the read command.

The memory controller 201 can control the nonvolatile memory device 200 so that the verify operation of a selection transistor described with reference to FIGS. 6 through 14 is performed on the whole nonvolatile memory device 200. The memory controller 201 can control the nonvolatile memory device 200 so that the verify operation of a selection transistor is performed on at least one memory cluster among the memory clusters 210 included in the nonvolatile memory device 200.

The memory controller 201 can control the nonvolatile memory device 200 so that a verify operation of a selection transistor is performed on a memory cluster in which referenced data is stored in response to a read command among the memory clusters 210.

The memory controller 201 can count a read command that references each memory cluster. The memory controller 201 can control the nonvolatile memory device 200 so that a verify operation of a selection transistor is performed on a memory cluster that the number of counts of a read command reaches a desired (or, alternatively a predetermined)

reference value. The memory controller 201 can store a count value with respect to each memory cluster in the register 202. The memory controller 201 can store a count value with respect to each memory cluster in the nonvolatile memory device 200.

In the case that a memory cluster that the number of read commands is counted is a memory chip unit, the memory controller 201 can control the nonvolatile memory device 200 so that a verify operation of a selection transistor is performed at random intervals. That is, the memory controller 201 can randomly set a reference value within a desired (or, alternatively a predetermined) range each time. The memory controller 201 can control the nonvolatile memory device 200 so that a verify operation of a selection transistor is performed on a memory cluster that the number of counts of a read command reaches a desired (or, alternatively a predetermined) reference value. The memory controller 201 can reset a reference value after a verify operation of a selection transistor is performed.

The memory controller 201 can perform a verify operation of a selection transistor on the nonvolatile memory device 200 in response to a write command provided from the host. The memory controller 201 can perform a verify operation of a selection transistor before data is stored in the nonvolatile memory device 200 in response to the write command. The memory controller 201 can perform a verify operation of a selection transistor after data is stored in the nonvolatile memory device 200 in response to the write command.

The memory controller 201 can perform a verify operation of a selection transistor on the nonvolatile memory device 200 in response to an erase command provided from the host. The memory controller 201 can perform a verify operation of a selection transistor on an erased memory cluster after a memory cluster included in the nonvolatile memory device 200 is erased.

After performing a verify operation of a selection transistor, the memory controller 201 can process memory clusters determined to be bad.

The memory controller 201 can control the nonvolatile memory device 200 so that data stored in memory clusters determined to be bad is read out. The memory controller 201 can store the data read out in a buffer memory.

In the process of reading out data, a voltage higher than a voltage being applied in a conventional reading process may be provided to selection lines connected to selection transistors of a memory cluster determined to be bad. In the process of reading out data, since a threshold voltage of a deteriorated transistor of a memory cluster is compensated using a desired (or, alternatively a predetermined) high voltage, stability of data being read out can be guaranteed.

The memory controller 201 can control the nonvolatile memory device 200 so that data read out from a memory cluster determined to be bad is stored in a normal memory cluster. At this time, the memory controller 201 can control the nonvolatile memory device 200 so that data stored in a buffer memory is stored in a normal memory cluster.

The memory controller 201 can process a prohibition of use of a memory cluster determined to be bad. Data storage operations are not performed on the use prohibited memory cluster. The memory controller 201 can store marking information designating the use prohibited memory clusters in the register 202. The memory controller 201 can perform a mapping operation on data provided from the host with reference to the marking information stored in the register 202. The memory controller 201 can perform a mapping operation using the marking information so that data is not mapped to the use prohibited memory cluster.

In response to a command being provided from the host, the memory system 20 can verify a selection transistor of the nonvolatile memory device 200 to detect deterioration of the selection transistor. The memory system 20 can improve or guarantee reliability of data stored in the nonvolatile memory device 200 using the verify operation of the selection transistor.

Figure 18:
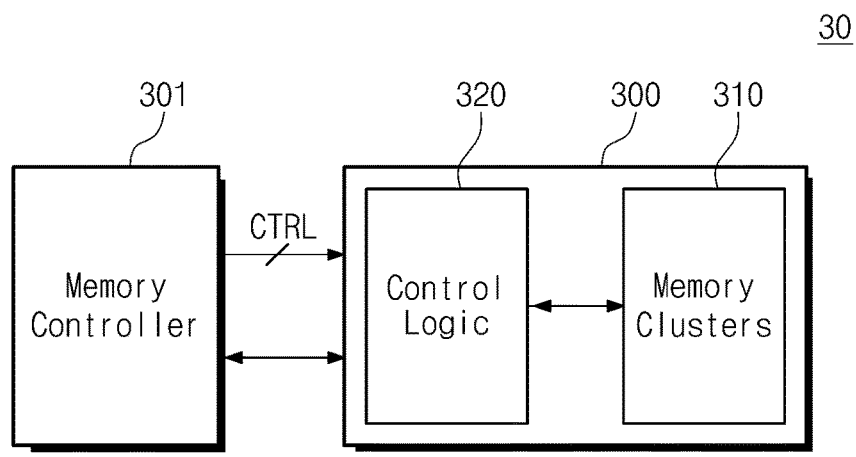
FIG. 18 is a block diagram illustrating a memory system in accordance with another embodiment of the inventive concepts.

FIG. 18 is a block diagram illustrating a memory system in accordance with another embodiment of the inventive concept. Referring to FIG. 18, a memory system 30 includes a nonvolatile memory device 300 and a memory controller 301.

When it is determined that a selection transistor is to be verified, the memory system 30 can verify the selection transistor of the nonvolatile memory device 300 to detect deterioration of the selection transistor. The memory system 30 can improve or guarantee reliability of data stored in the nonvolatile memory device 300 using a verify operation of the selection transistor.

The memory controller 301 controls a data processing operation of the nonvolatile memory device 300 in response to the command provided from the host. For example, the memory controller 301 can provide data stored in the nonvolatile memory device 300 to the host in response to a read command. The memory controller 301 can store data provided from the host in the nonvolatile memory device 300 in response to a program command.

The nonvolatile memory device 300 includes control logic 320 and a plurality of memory clusters 310. The control logic 320 stores data provided from the host in the memory clusters 310 under the control of the memory controller 301.

When it is determined that a selection transistor is to be verified, the memory system 30 can perform a verify operation of a selection transistor on the memory clusters 310. A unit of a memory cluster is not limited. For example, a memory cluster may be a memory string including a selection transistor. The memory cluster may also be a block including at least one memory string, or a memory chip including at least one memory block.

The control logic 320 can determine that a selection transistor is to be verified in response to a control signal CTRL provided from the memory controller 301. At this time, control logic 320 can perform a verify operation of a selection transistor on the memory clusters 310 in response to the control signal CTRL.

The control logic 320 can perform a verify operation of a selection transistor on the memory clusters 310 in response to a read or write control signal provided from the memory controller 301. The control logic 320 can perform a verify operation of a selection transistor before reading out data stored in the memory clusters 310 or storing data in the memory clusters 310 in response to the read or write control signal. The control logic 320 can perform a verify operation of a selection transistor after reading out data stored in the memory clusters 310 or storing data in the memory clusters 310 in response to the read or write control signal.

The control logic 320 can control the memory clusters 310 so that the verify operation of a selection transistor described with reference to FIGS. 6 through 14 is performed on the whole memory cluster 310. The control logic 320 can control the memory clusters 310 so that the verify operation of a selection transistor is performed on at least one memory cluster among the memory clusters 310.

The control logic 320 can control the memory clusters 310 so that a verify operation of a selection transistor is performed on a memory cluster in which referenced data is stored in response to a read or write control signal among the memory clusters 310.

The control logic 320 can count a read command that references each memory cluster. The control logic 320 can control the memory clusters 310 so that a verify operation of a selection transistor is performed on a memory cluster that the number of counts of a read control signal reaches a desired (or, alternatively a predetermined) reference value. The control logic 320 can store a count value with respect to each memory cluster in a desired (or, alternatively a predetermined) register. The control logic 320 can store a count value with respect to each memory cluster in the memory clusters 310.

The control logic 320 can perform a verify operation of a selection transistor on the memory clusters 310 in response to an erase control signal provided from the memory controller 301. The control logic 320 can perform a verify operation of a selection transistor on an erased memory cluster after erasing data stored in a memory cluster in response to the erase control signal.

The memory controller 301 or the control logic 320 can perform a verify operation of a selection transistor on the memory clusters 310 during an idle time of the nonvolatile memory device 300.

After performing a verify operation of a selection transistor, the memory controller 301 or the control logic 320 can process memory clusters determined to be bad.

The control logic 320 can store marking information designating memory clusters determined to be bad in a register. The control logic 320 can perform a copy-back operation on data stored in the memory clusters determined to be bad. The control logic 320 can process a prohibition of use of a memory cluster determined to be bad. Data storage operation is not performed on the use prohibited memory cluster. In the case that the control logic 320 performs a verify operation of a selection transistor on the memory clusters 310 in response to an erase control signal provided from the memory controller 301, the control logic 320 can process memory clusters determined to be bad as an erase fail.

The control logic 320 can provide the marking information to the outside, for example, the memory controller 301.

The memory controller 301 can perform a copy-back operation on data stored in the memory clusters determined to be bad. The memory controller 301 can process a prohibition of use of a memory cluster determined to be bad. Data storage operation is not performed on the use prohibited memory cluster.

The memory controller 301 can control the nonvolatile memory device 300 so that data stored in memory clusters determined to be bad is read out. The memory controller 301 can store the data read out in a buffer memory.

In the process of reading out data, a voltage higher than a voltage being applied in a conventional reading process may be provided to selection lines connected to selection transistors of a memory cluster determined to be bad. In the process of reading out data, since a threshold voltage of a deteriorated transistor of a memory cluster is compensated using a desired (or, alternatively a predetermined) high voltage, stability of data being read out can be guaranteed.

The memory controller 301 can control the nonvolatile memory device 300 so that data read out from a memory cluster determined to be bad is stored in a normal memory cluster. At this time, the memory controller 301 can control the nonvolatile memory device 300 so that data stored in a buffer memory is stored in a normal memory cluster.

The memory controller 301 can perform a mapping operation on data provided from the host. The memory controller 301 can perform a mapping operation using the marking information so that data is not mapped to the use prohibited memory cluster.

The memory system 30 can verify a selection transistor of the nonvolatile memory device 300 to detect deterioration of the selection transistor. The memory system 30 can improve or guarantee of data stored in the nonvolatile memory device 300 using the verify operation of the selection transistor.

Figure 19:
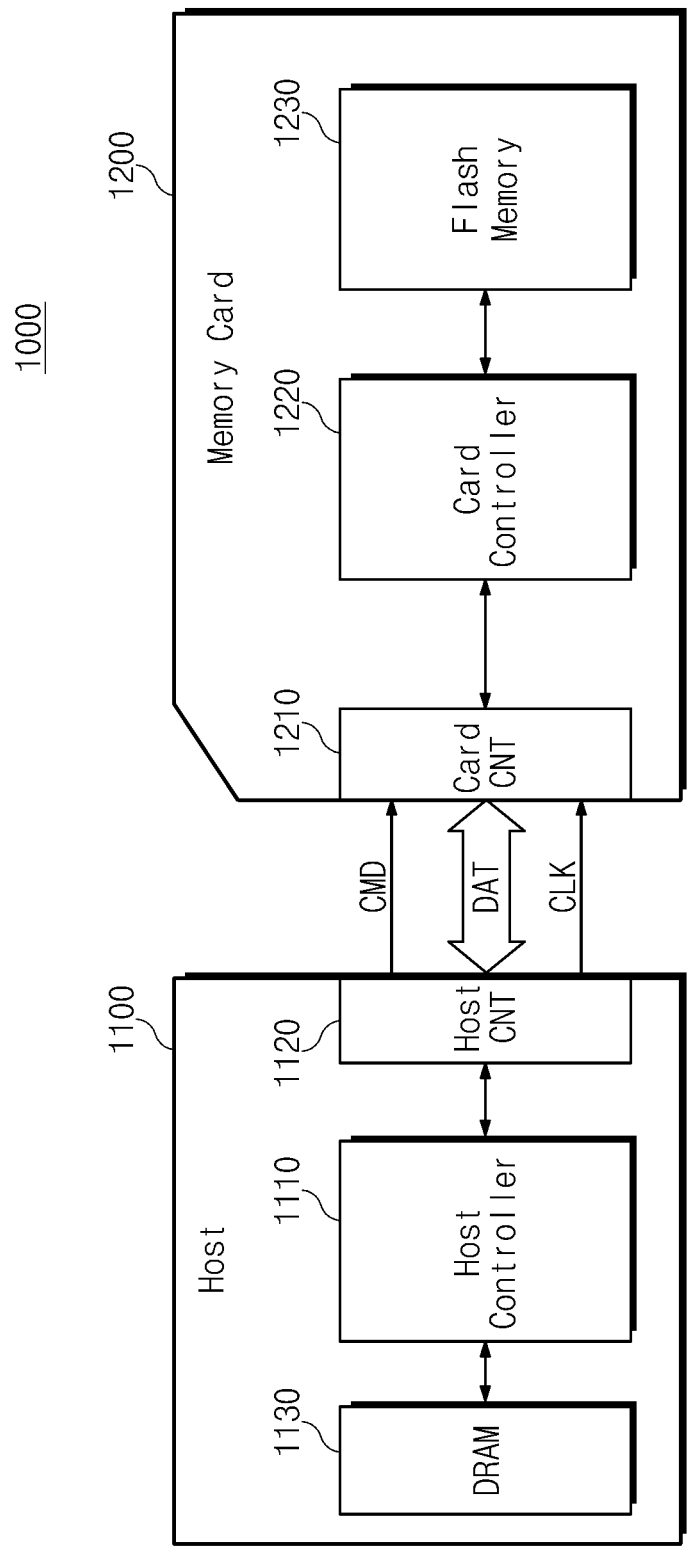
FIG. 19 is a block diagram illustrating a memory card system to which a nonvolatile memory device in accordance with an embodiment of the inventive concepts is applied.

FIG. 19 is a block diagram illustrating a memory card system to which a nonvolatile memory device in accordance with an embodiment of the inventive concept is applied. A memory card system 1000 includes a host 1100 and a memory card 1200. The host 1100 includes a host controller 1110, a host connection unit 1120 and a DRAM 1130.

The host 1100 writes data in the memory card 1200 or reads data stored in the memory card 1200. The host controller 1110 transmits a command (e.g., a write command), a clock signal CLK generated by a clock generator in the host 1100 and data DATA to the memory card 1200 through the host connection unit 1120. The DRAM 1130 is a main memory of the host 1100.

The memory card 1200 includes a card connection unit 1210, a card controller 1220 and a flash memory 1230. The card controller 1220 stores data in the flash memory 1230 in synchronization with a clock signal generated by a clock generator (not shown) in the card controller 1220 in response to a command received through the card connection unit 1210. The flash memory 1230 stores data transmitted from the host 1100. For example, in the case that the host 1100 is a digital camera, the flash memory 1230 stores image data.

The memory card system 1000 can verify a selection transistor of the flash memory 1230 to detect deterioration of the selection transistor. The memory card system 1000 can improve or guarantee reliability of data stored in the flash memory 1230 using the verify operation of the selection transistor.

Figure 20:
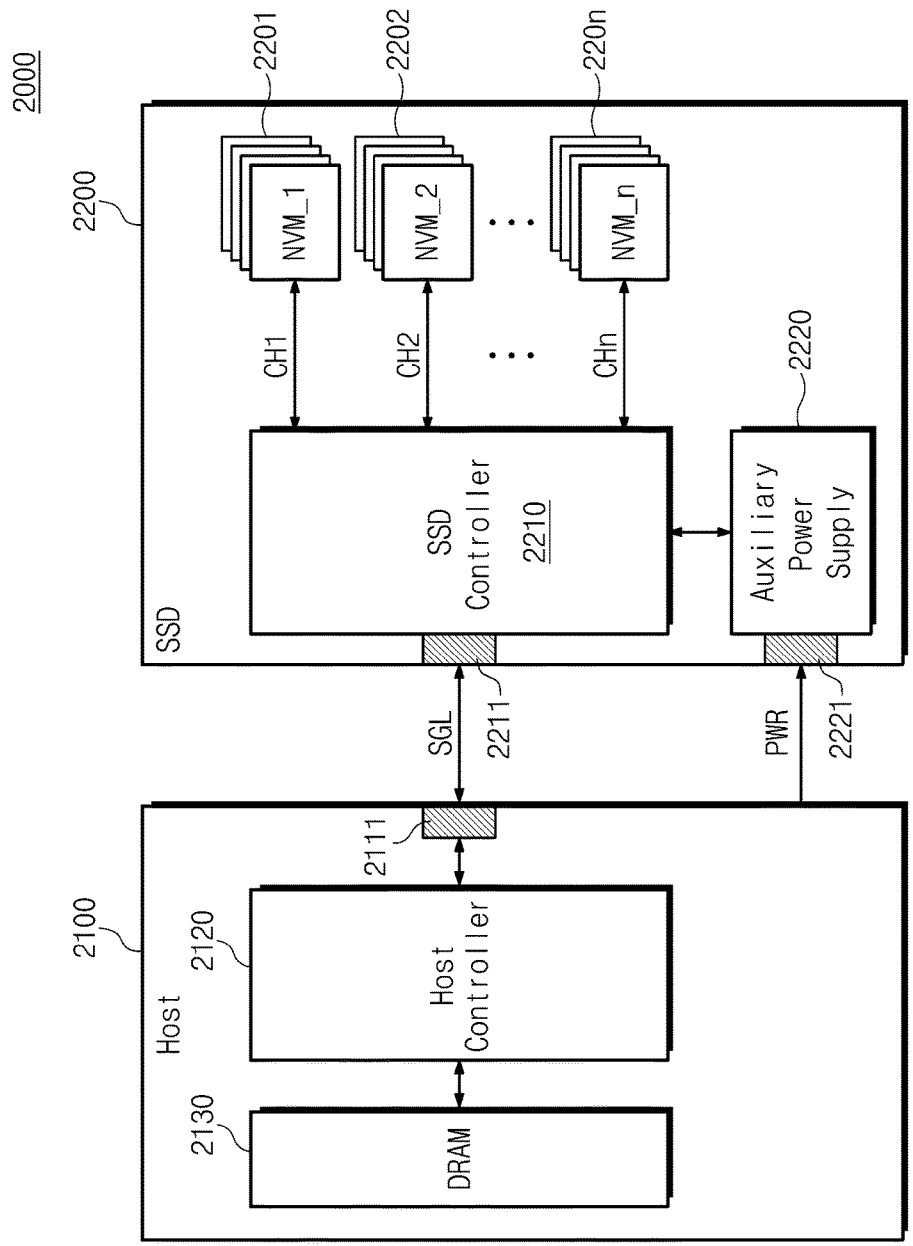
FIG. 20 is a block diagram illustrating a solid state drive (SSD) system to which a nonvolatile memory device in accordance with an embodiment of the inventive concepts is applied.

FIG. 20 is a block diagram illustrating a solid state drive (SSD) system to which a nonvolatile memory device in accordance with an embodiment of the inventive concepts is applied.

Referring to FIG. 20, a SSD system 2000 includes a host 2100 and a SSD 2200. The host 2100 includes a host interface 2111, a host controller 2120 and a DRAM 2130.

The host 2100 writes data in the SSD 2200 or reads data stored in the SSD 2200. The host controller 2120 transmits a signal SGL such as a command, an address, a control signal, etc. to the SSD 2200 through the host interface 2111. The DRAM 2130 is a main memory of the host 2100.

The SSD 2200 exchanges a signal SGL with the host 2100 through the host interface 2211 and is supplied with power through a power connector 2221. The SSD 2200 may include a plurality of nonvolatile memories 2201~220$n$, a SSD controller 2210 and an auxiliary power supply 2220. The nonvolatile memories 2201~220$n$ can be embodied by a PRAM, a MRAM, an ReRAM, a FRAM, etc. besides a NAND flash memory.

The nonvolatile memories 2201~220$n$ are used as a storage medium of the SSD 2200. The nonvolatile memories 2201~220$n$ can be connected to a SSD controller 2210 through a plurality of channels CH1~CHn. One or more nonvolatile memories can be connected to one channel.

Nonvolatile memories connected to one channel can be connected to a same data bus.

The SSD controller 2210 exchanges a signal SGL with the host 2100 through the host interface 2211. The signal SGL may include a command, an address, data, etc. The SSD controller 2210 writes data in a corresponding nonvolatile memory device or reads data from a corresponding nonvolatile memory device according to a command of the host 2100.

The auxiliary power supply 2220 is connected to the host 2100 through the power connector 2221. The auxiliary power supply 2220 receives power from the host 2100 to be charged. The auxiliary power supply 2220 may be located inside the SSD 2200 or outside the SSD 2200. For example, the auxiliary power supply 2220 can be located on a main board to provide an auxiliary power to the SSD 2200.

Figure 21:
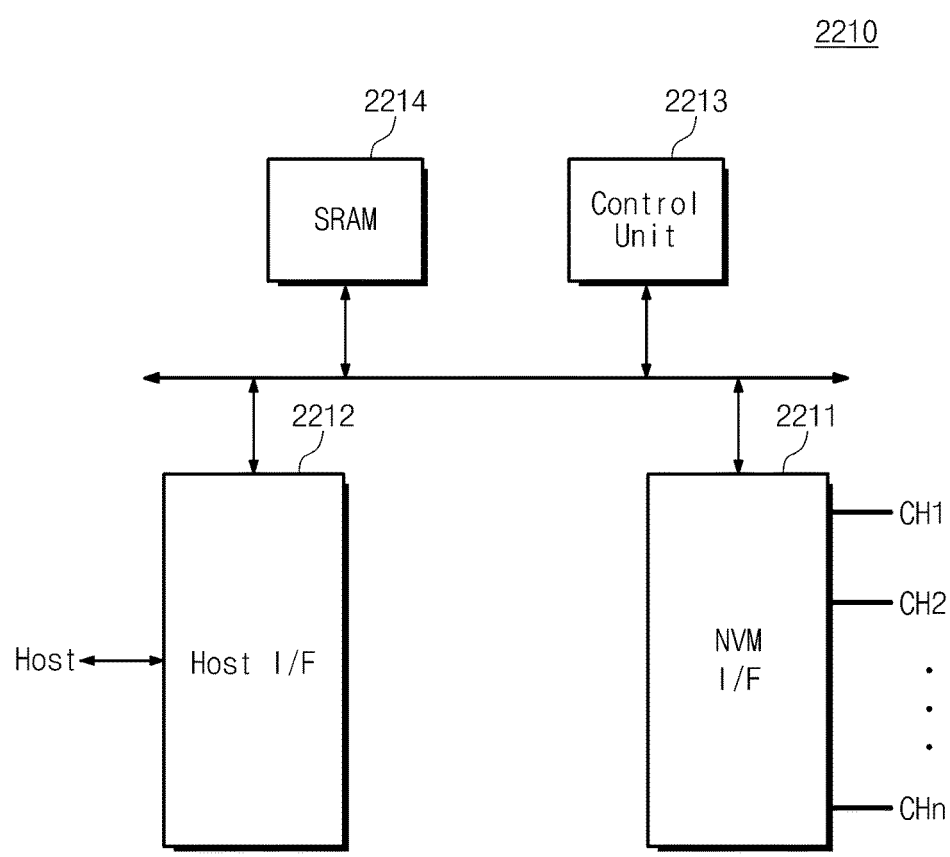
FIG. 21 is a block diagram illustrating a constitution of a SSD controller illustrated in FIG. 20.

FIG. 21 is a block diagram illustrating a constitution of a SSD controller illustrated in FIG. 20. Referring to FIG. 21, the SSD controller 2210 includes an NVM interface 2211, a host interface 2212, a control unit 2213 and a SRAM 2214.

The NVM interface 2211 scatters data transmitted from a main memory of the host 2100 on respective channels CH1~CHn. The NVM interface 2211 transmits data read from the nonvolatile memories 2201~220n to the host 2100 via the host interface 2212.

The host interface 2212 provides an interface with the SSD 2200 in response to a protocol of the host 2100. The host interface 2212 can communicate with the host 2100 using a universal serial bus (USB), a small computer system interface (SCSI), a PCI express, an ATA, a parallel ATA (PATA), a serial ATA (SATA), a serial attached SCSI (SAS), etc. The host interface 2212 can perform a disk emulation function so that the host 2100 recognizes the SSD 2200 as a hard disk drive (HDD).

The control unit 2213 analyzes and processes a signal SGL received from the host 2100. The control unit 2213 controls the host 2100 or the nonvolatile memories 2201~220n through the host interface 2212 or the NVM interface 2211. The control unit 2213 controls an operation of the nonvolatile memories 2201~220n according to a firmware for driving the SSD 2200.

The SRAM 2214 can be used to drive software (S/W) being used for an efficient management of the nonvolatile memories 2201~220n. The SRAM 2214 can store meta data received from a main memory of the host 2100 or stores cache data. In a sudden power off operation, meta data or cache data stored in the SRAM 2214 can be stored in the nonvolatile memories 2201~220n using the auxiliary power supply 2220.

Further referring to FIG. 20, the SSD system 2000 can verify a selection transistor of the nonvolatile memories 2201~220n to detect deterioration of the selection transistor. The SSD system 2000 can improve or guarantee reliability of data stored in the nonvolatile memories 2201~220n using the verify operation of the selection transistor.

In FIGS. 20 and 21, the SRAM 2214 can be replaced with a nonvolatile memory. The SSD system 2000 in accordance with another embodiment of the inventive concepts can be embodied so that a nonvolatile memory device such as a flash memory, a PRAM, an RRAM, a MRAM, etc. performs a function of the SRAM 2214.

Figure 22:
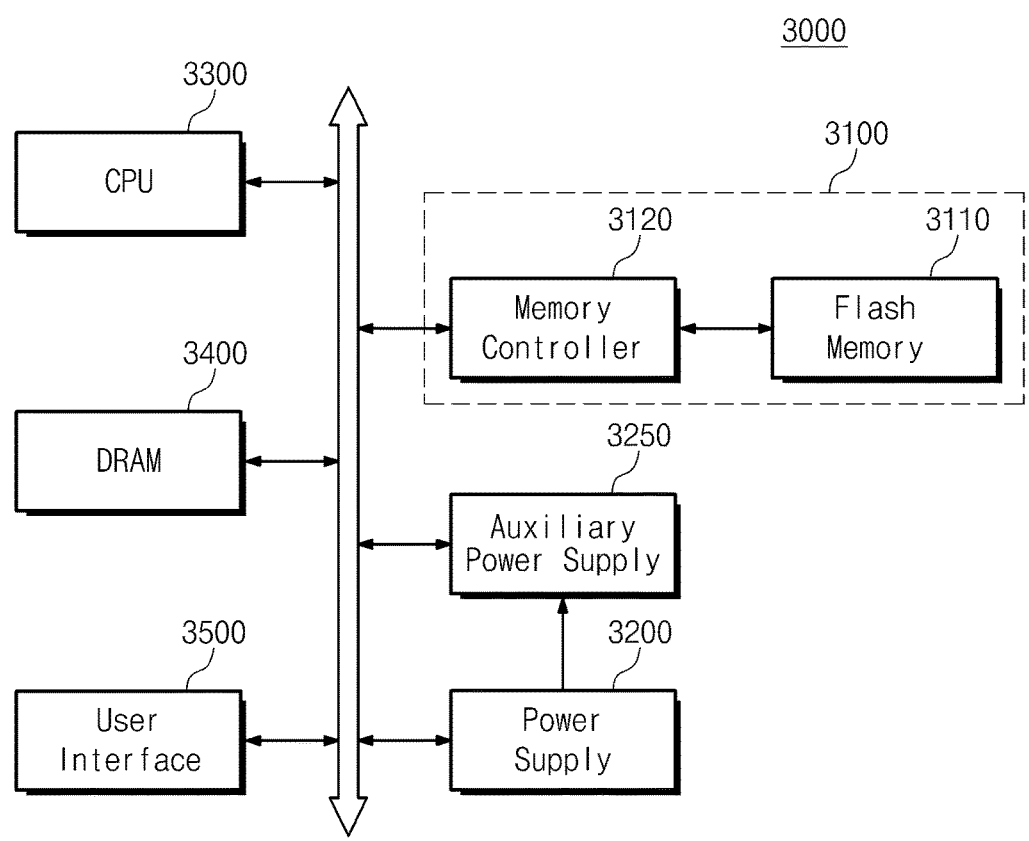
FIG. 22 is a block diagram illustrating an example that a nonvolatile memory device in accordance with an embodiment of the inventive concepts is embodied by an electronic device.

FIG. 22 is a block diagram illustrating an example that a nonvolatile memory device in accordance with an embodiment of the inventive concepts is embodied by an electronic device. An electronic device 3000 may be embodied by a personal computer PC or a portable electronic device such as a notebook computer, a cell phone, a personal digital assistant (PDA), and a camera.

Referring to FIG. 22, the electronic device 3000 includes a memory device 3100, a power supply 3200, an auxiliary power supply 3250, a central processing unit 3300, a DRAM 3400, and a user interface 3500. The memory device 3100 includes a flash memory 3110 and a memory controller 3120. The memory device 3100 can be built in the electronic device 3000.

As described above, the electronic device 3000 can verify a selection transistor of the flash memory 3110 to detect deterioration of the selection transistor. The electronic device 3000 can improve or guarantee reliability of data stored in the flash memory 3110 using the verify operation of the selection transistor.

The foregoing is illustrative of the inventive concepts and is not to be construed as limiting thereof. Although a few embodiments of the inventive concepts have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

We claim:

1. A method of managing a memory, comprising:
applying a gate voltage to a gate of a selection transistor of a currently programmed memory string in the memory;
determining whether the selection transistor turns off based on output from the currently programmed memory string;
determining whether the selection transistor has deteriorated based on the determining whether the selection transistor turns off; and
copying data in the currently programmed memory string to a different memory string of the memory if the determining determines the selection transistor has deteriorated.

2. The method of claim 1, wherein the gate voltage is a first gate voltage, the copying applies a second gate voltage to the selection transistor, and the first gate voltage is greater than the second gate voltage.

3. The method of claim 1, wherein the gate voltage is greater than applied during a read operation.

4. The method of claim 1, wherein
the currently programmed memory string includes a plurality of memory cell transistors connected in series between a string selection transistor and a ground selection transistor; and
the determining determines whether either one of the ground selection transistor and the string selection transistor has deteriorated.

5. The method of claim 1, wherein
the currently programmed memory string includes a string selection transistor, at least a first dummy memory cell transistor, a plurality of memory cell transistors, at least a second dummy memory cell transistor, and a ground selection transistor connected in series; and
the determining determines whether either one of the ground selection transistor and the string selection transistor has deteriorated.

6. The method of claim 1, further comprising:
performing the determining whether the selection transistor has deteriorated in response to a command.

7. The method of claim 6, wherein the command is one of a program command and a read command.

8. The method of claim 6, wherein the command is a verification command, which indicates to perform the determining.

9. The method of claim 6, further comprising:
receiving the command from a host.

10. The method of claim 6, further comprising:
receiving the command from a memory controller associated with the memory.

11. The method of claim 6, wherein the performing performs the determining whether the selection transistor has deteriorated before or after an operation associated with the command.

12. The method of claim 6, wherein the performing comprises:
generating a count value indicating a number of times the command is received;
triggering performance of the determining whether the selection transistor has deteriorated if the count value exceeds a reference value.

13. The method of claim 12, wherein the reference value is randomly generated.

14. The method of claim 12, wherein the triggering triggers the determining whether the selection transistor has deteriorated for at least one currently programmed memory string in a memory cluster which was most recently accessed based on the command.

15. The method of claim 6, wherein the performing comprises:
generating a count value indicating a number of times the command is received for a memory cluster including the currently programmed memory string; and
triggering performance of the determining whether the selection transistor has deteriorated if the count value exceeds a reference value.

16. The method of claim 1, further comprising:
performing the determining whether the selection transistor has deteriorated based on a wear level of a memory cluster including the currently programmed memory string.

17. The method of claim 1, further comprising:
determining whether a memory cluster is bad based on a number of memory strings in the memory cluster determined to be deteriorated; and
prohibiting access to the memory cluster if the memory cluster is determined to be bad.

18. The method of claim 1, wherein the memory is a vertical NAND.

19. A method of operating a nonvolatile memory device, the nonvolatile memory device including a plurality of memory cells formed to be perpendicular to a substrate and a plurality of cell strings being connected in common to a bit line, each of the plurality of cell strings includes serially-connected memory cells among the plurality of memory cells and a selection transistor, comprising:
applying a first selection voltage to a gate of a selection transistor of a cell string from among the plurality of cell strings;
determining a deterioration of the selection transistor based on whether the selection transistor is turned off; and
copying data programmed in memory cells of the cell string to memory cells of a different cell string.

20. The method of claim 19, wherein
the copying includes applying a second selection voltage greater than the first selection voltage to the gate of the selection transistor to turn on the selection transistor.

* * * * *